United States Patent
Park

(10) Patent No.: US 11,145,248 B2
(45) Date of Patent: Oct. 12, 2021

(54) DISPLAY DEVICE AND METHOD FOR MANUFACTURING SAME

(71) Applicant: SAMSUNG DISPLAY CO., LTD., Yongin-si (KR)

(72) Inventor: Cheondeok Park, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 16/660,541

(22) Filed: Oct. 22, 2019

(65) Prior Publication Data

US 2020/0168689 A1    May 28, 2020

(30) Foreign Application Priority Data

Nov. 23, 2018  (KR) .................... 10-2018-0146247

(51) Int. Cl.
*G09G 3/3225*     (2016.01)
*H01L 27/32*      (2006.01)
(Continued)

(52) U.S. Cl.
CPC ..... *G09G 3/3225* (2013.01); *G02F 1/136204* (2013.01); *G06F 3/0412* (2013.01);
(Continued)

(58) Field of Classification Search
CPC ..... G02F 2202/22; G02F 2001/133334; G02F 1/136204; H02H 9/046; H02H 9/045; H02H 9/04; H02H 9/044; H05K 9/0067; H05K 1/0259; H05K 2201/10128; H05K 1/026; G06F 3/041–047; G06F 2203/04107; G09G 2300/0426; G09G 2330/04

See application file for complete search history.

(56) References Cited

U.S. PATENT DOCUMENTS 8,507,157 B2   8/2013 Lee
9,989,811 B2   6/2018 Go et al.
(Continued)

FOREIGN PATENT DOCUMENTS

KR    10-1307963       9/2013
KR    10-2016-0059315  5/2016

*Primary Examiner* — Sanjiv D. Patel
(74) *Attorney, Agent, or Firm* — F. Chau & Associates, LLC

(57) ABSTRACT

A display device is provided including a display substrate with a base layer including an active area and a peripheral area. A circuit element layer is disposed on the base layer, and a display element layer connects to the circuit element layer and provides light. An encapsulation substrate is disposed on the display substrate. A sealing unit is disposed between the display substrate and encapsulation substrate. An input sensing layer is disposed on the encapsulation substrate and includes a first conductive layer and a second conductive layer spaced apart with a sensing insulation layer therebetween. A static electricity blocking unit is disposed on the encapsulation substrate. The static electricity blocking unit includes a first blocking pattern and a second blocking pattern separated by a separation space. A connection pattern connects the first blocking pattern and the second blocking pattern, and a portion of the sealing unit overlaps the separation space.

23 Claims, 20 Drawing Sheets

(51) Int. Cl.
  *H01L 51/52* (2006.01)
  *H01L 51/56* (2006.01)
  *G06F 3/041* (2006.01)
  *G06F 3/044* (2006.01)
  *G02F 1/1362* (2006.01)

(52) U.S. Cl.
  CPC .......... *G06F 3/0445* (2019.05); *G06F 3/0446* (2019.05); *H01L 27/3232* (2013.01); *H01L 51/5253* (2013.01); *H01L 51/56* (2013.01); *G06F 2203/04103* (2013.01); *G06F 2203/04107* (2013.01); *G06F 2203/04112* (2013.01); *H01L 2227/323* (2013.01)

(56) References Cited

U.S. PATENT DOCUMENTS

| | | | | |
|---|---|---|---|---|
| 2013/0154979 A1* | 6/2013 | Li | .......................... | G06F 3/0446 345/173 |
| 2014/0176825 A1* | 6/2014 | Lee | ....................... | G06F 3/0446 349/12 |
| 2017/0153472 A1 | 6/2017 | Go et al. | | |
| 2017/0358769 A1* | 12/2017 | Kim | .................... | H01L 27/3262 |
| 2018/0039123 A1* | 2/2018 | Kim | .................... | G02F 1/13338 |
| 2018/0145066 A1 | 5/2018 | Lee | | |
| 2019/0036073 A1* | 1/2019 | Yu | ........................... | G06F 3/047 |
| 2020/0125202 A1* | 4/2020 | Li | .......................... | H01L 51/56 |

\* cited by examiner

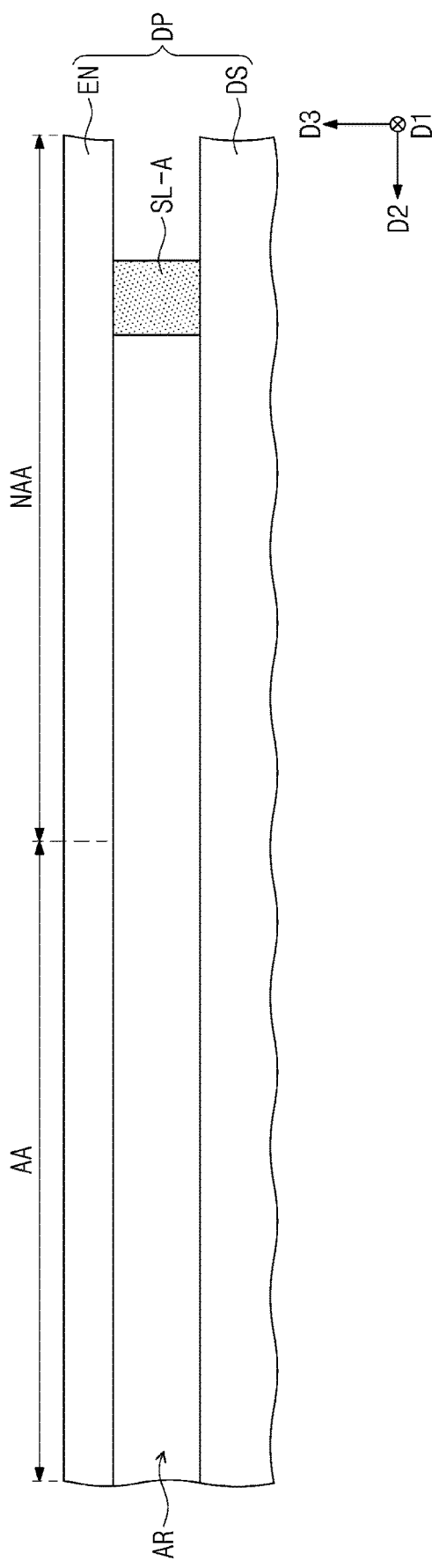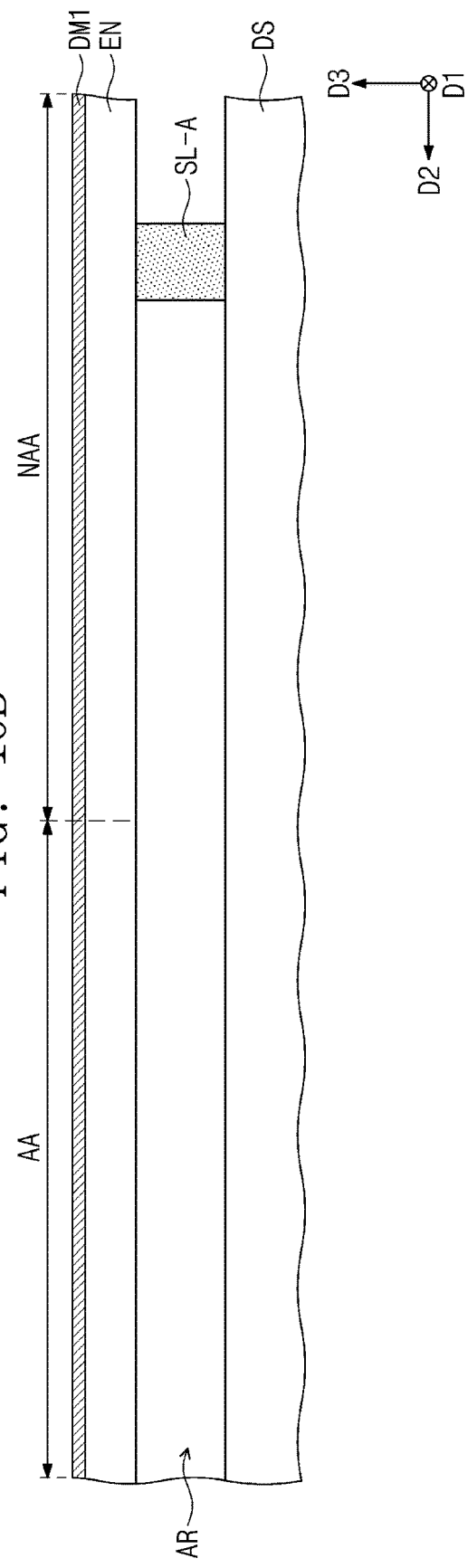

DISPLAY DEVICE AND METHOD FOR MANUFACTURING SAME

CROSS-REFERENCE TO RELATED APPLICATION

This U.S. non-provisional patent application claims priority under 35 U.S.C. § 119 to Korean Patent Application No. 10-2018-0146247, filed on Nov. 23, 2018, the disclosure of which is incorporated by reference herein in its entirely.

TECHNICAL FIELD

The present inventive concept relates to a display device, and more particularly, to a display device including a static electricity blocking unit and a method of manufacturing the same.

DISCUSSION OF RELATED ART

A display device is activated by an electrical signal. The display device may include a display panel for displaying an image upon activation. Organic light emitting diode (OLED) display panels have relatively low power consumption, high brightness, and a high reaction speed. An organic light emitting display panel may include a red organic light emitting layer, a green organic light emitting layer, and a blue organic light emitting layer which respectively correspond to a red pixel region, a green pixel region, and the blue pixel region. A method of manufacturing an organic light emitting display panel may include first forming an organic light emitting layer that emits white light to a red pixel region, a green pixel region, and a blue pixel region, and then forming a red color filter, a green color filter, and a blue color filter respectively thereon.

SUMMARY

The present disclosure provides for a display device capable of removing static electricity inside the display device, thereby increasing reliability.

According to an exemplary embodiment of the present inventive concept, a display device is provided including a display substrate that includes a base layer including an active area and a peripheral area adjacent to the active area. A circuit element layer is disposed on the base layer, and a display element layer is electrically connected to the circuit element layer and configured to provide light. An encapsulation substrate is disposed on the display substrate. A sealing unit is disposed between the display substrate and the encapsulation substrate and overlaps the peripheral area. An input sensing layer is disposed on the encapsulation substrate and includes a first conductive layer and a second conductive layer spaced apart from each other with a sensing insulation layer interposed therebetween. A static electricity blocking unit is disposed on the encapsulation substrate. The static electricity blocking unit includes a first blocking pattern and a second blocking pattern spaced apart from each other by a separation space. A connection pattern connects the first blocking pattern and the second blocking pattern, and at least a portion of the sealing unit overlaps the separation space.

According to an exemplary embodiment of the present inventive concept, at least one of the first blocking pattern and the second blocking pattern has a first resistance, and the connection pattern has a second resistance greater than the first resistance.

According to an exemplary embodiment of the present inventive concept, a portion of the connection pattern overlaps the sealing unit in a plan view.

According to an exemplary embodiment of the present inventive concept, the connection pattern comprises a transparent conductive material.

According to an exemplary embodiment of the present inventive concept, the connection pattern is provided in plural and each of the plurality of connection patterns are spaced apart from each other.

According to an exemplary embodiment of the present inventive concept, the display device of claim 1, wherein the connection pattern has a zig-zag shape.

According to an exemplary embodiment of the present inventive concept, the connection pattern includes a curved shape.

According to an exemplary embodiment of the present inventive concept, the first blocking pattern is disposed closer to the active area than the second blocking pattern.

According to an exemplary embodiment of the present inventive concept, at least one of the first blocking pattern and the second blocking pattern comprises an upper portion adjacent to the active area, a lower portion opposite to the upper portion, and a side portion connecting the upper portion and the lower portion. The side portion is inclined from an end of the lower portion toward an end of the upper portion.

According to an exemplary embodiment of the present inventive concept, the static electricity blocking unit further comprises an additional blocking pattern spaced apart from the second blocking pattern with the input sensing layer interposed therebetween. The additional blocking pattern is disposed in a same layer as the first conductive layer.

According to an exemplary embodiment of the present inventive concept, the circuit element layer comprises a semiconductor layer including a transistor. The display element layer further comprises a first electrode, a second electrode disposed opposite to the first electrode, and an organic light emitting element including a light emitting pattern disposed between the first electrode and the second electrode. The light emitting patterns does not overlap the first conductive layer and the second conductive layer on a plane.

According to an exemplary embodiment of the present inventive concept, the sealing unit comprises frit.

According to an exemplary embodiment of the present inventive concept, the sensing insulation layer includes first contact holes that overlap the first blocking pattern and second contact holes that overlap the second blocking pattern, and the connection pattern is connected to the first blocking pattern through the first contact holes and connected to the second blocking pattern through the second contact holes.

According to an exemplary embodiment of the present inventive concept, a display device is provided including a display substrate including a base layer including an active area and a peripheral area disposed adjacent to the active area. An encapsulation substrate covers the display substrate, and a sealing unit is disposed between the display substrate and the encapsulation substrate and overlaps the peripheral area. An input sensing layer is disposed on the encapsulation substrate and includes a first conductive layer and a second conductive layer spaced apart from each other with a sensing insulation layer interposed therebetween. A static electricity blocking unit is disposed on the encapsulation substrate and overlaps the peripheral area. The static electricity blocking unit includes a first blocking pattern and a second blocking pattern each having a first resistance and spaced apart from each other by a separation space, and a connection pattern having a second resistance is connected to the first blocking pattern at one end and the second blocking pattern at another end and the second resistance is greater than the first resistance.

According to an exemplary embodiment of the present inventive concept, the at least a portion of the sealing unit overlaps the separation space, and wherein a width of the sealing unit in a plan view is smaller than a width of the separation space.

According to an exemplary embodiment of the present inventive concept, the first blocking pattern and the second blocking pattern are disposed in a same sensing insulation layer as the first conductive layer, and the connection pattern is disposed in a same sensing insulation layer as the second conductive layer.

According to an exemplary embodiment of the present inventive concept, a portion of the connection pattern overlaps the sealing unit in a plan view.

According to an exemplary embodiment of the present inventive concept, the connection pattern comprises a transparent conductive material.

According to an exemplary embodiment of the present inventive concept, a method for manufacturing a display device, the method comprising providing a display panel including a display substrate having a plurality of pixels and divided into an active area on which the pixels are formed and a peripheral area adjacent to the active area, an encapsulation substrate at least partially covering the display substrate, and a preliminary sealing unit disposed between the display substrate and the encapsulation substrate in the peripheral area. Forming a first preliminary conductive layer on the encapsulation substrate. Forming a first conductive layer by patterning a portion of the first preliminary conductive layer overlapping the active area. Forming a plurality of blocking patterns spaced apart from each other by a predetermined separation space by patterning a portion of the first preliminary conductive layer overlapping the peripheral area. Forming a second preliminary conductive layer on the first conductive layer. Forming a second conductive layer by patterning a portion of the preliminary second conductive layer overlapping the active area. Forming a connection pattern which connects the blocking patterns by patterning a portion of the preliminary second conductive layer overlapping the peripheral area. Forming a sealing unit by irradiating the preliminary sealing unit with a laser, wherein the sealing unit is formed by irradiating the separation space with the laser to cure the preliminary sealing unit.

According to an exemplary embodiment of the present inventive concept, the first conductive layer and the blocking patterns are formed by a first mask, and the second conductive layer and the connection pattern are formed by a second mask different from the first mask.

According to an exemplary embodiment of the present inventive concept, the first blocking pattern and the second blocking pattern include a same material as the first conductive layer, and wherein the connection pattern includes a same material as the second conductive layer.

BRIEF DESCRIPTION OF THE FIGURES

The above and other aspects and features of the present disclosure will be more clearly understood from the following detailed description taken in conjunction the accompanying drawings, in which:

FIG. 10A to FIG. 10G are cross-sectional views illustrating steps in a method of manufacturing a display device according to an exemplary embodiment of the present inventive concept.

DETAILED DESCRIPTION OF THE EMBODIMENTS

Figure 1:
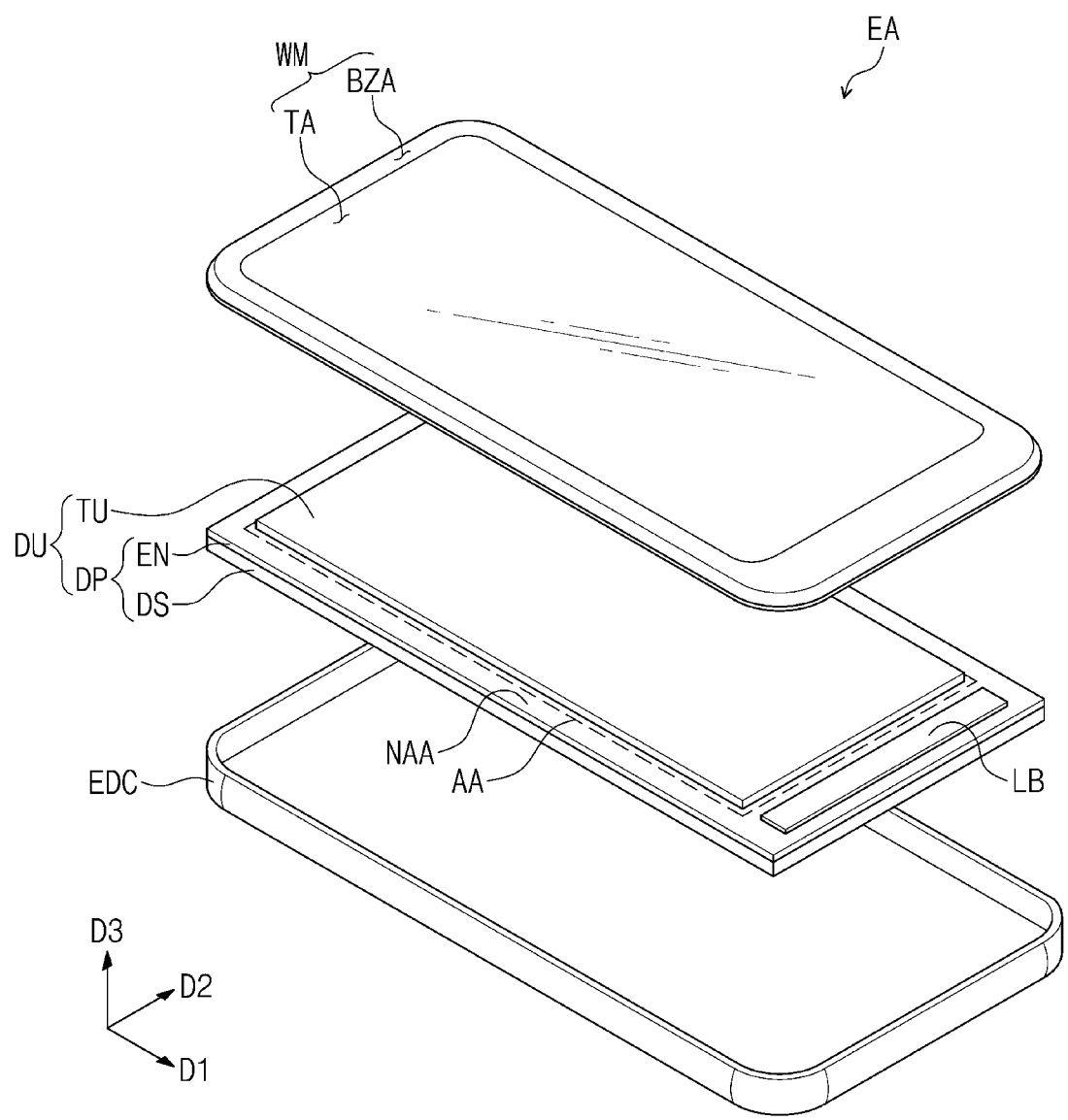
FIG. 1 is an exploded perspective view illustrating a display device according to an exemplary embodiment of the present inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals may refer to like elements. Also, in the drawings, the thickness, the ratio, and the dimensions of elements miry be exaggerated for an effective description of technical contents.

The term "and/or," includes all combinations of one or more of which associated configurations may define.

FIG. 1 is an exploded perspective view illustrating a display device according to an exemplary embodiment of the present inventive concept. Referring to FIG. 1, a display device EA according to an exemplary embodiment of the present inventive concept may include a window layer WM, a display module DU, a static electricity blocking unit LP, and a cover case EDC.

The window layer WM may have a single-layered structure or a multi-layered structure. For example, the window layer WM may have a laminated structure in which a plurality of plastic films are adhered to each other with an adhesive, or a laminated structure in which a glass substrate and a plastic film are adhered to each other with an adhesive. The window layer WM may be optically transparent. For example, the window layer WM may include glass and/or plastic.

A front surface of the window layer WM may be partitioned into a transmissive area TA and a bezel area BZA. The transmissive area TA may be a region for transmitting light provided from a display panel DP. The transmissive area TA may have a shape corresponding to an active area AA of the display panel DP. For example, the transmissive area TA may overlap the entire surface or a portion of the active area AA. Accordingly, an image displayed on the active area AA of the display panel DP may be viewed from the outside through the transmissive area TA.

The bezel area BZA may be a region that has lower light transmittance relative to the light transmittance of the transmissive area TA. The bezel area BZA may correspond to the shape of the transmissive area TA. The bezel area BZA may be disposed adjacent to the transmissive area TA, and may have a closed line shape at least partially surrounding the transmissive area TA.

The bezel area BZA may have a predetermined color. The bezel area BZA may at least partially cover a peripheral area NAA of the display panel DP and block the peripheral area NAA from being viewed from the outside. For example, when light generated from the display panel DP leaks into the peripheral area NAA, the bezel area BZA may block the leaked light to prevent the peripheral area NAA from transmitting light to the outside.

However, the present inventive concept is not limited thereto, and the bezel area BZA according to an exemplary embodiment of the present inventive concept may be omitted. Also, the bezel area BZA of a region adjacent to at least one of four sides defining the transmission area TA may be omitted, and the shape of the bezel area BZA is not limited to any particular shape.

The display module DU includes the display panel DP and an input sensing layer TU. The display panel DP according to an exemplary embodiment of the present inventive concept includes a display substrate DS and an encapsulation substrate EN. The encapsulation substrate EN is disposed on the display substrate DS and at least partially covers the display substrate DS. The input sensing layer TU may be disposed on the encapsulation substrate EN to cover the active area AA only. However, the present inventive concept is not limited thereto. For example, the input sensing layer TU may cover both the peripheral area NAA and the active area AA.

The static electricity blocking unit LB may be disposed on the encapsulation substrate EN. The static electricity blocking unit LB may overlap the peripheral area NAA. The static electricity blocking unit LB is disposed apart from a sensing sensor of the input sensing layer TU, to be described later.

The static electricity blocking unit LB may provide a path through which static electricity introduced from the outside passes so as to offset the static electricity. The components of the display device EA according to an exemplary embodiment of the present inventive concept may increase reliability by effectively offsetting static electricity with the static electricity blocking unit LB.

The static electricity blocking unit LB may include conductive layers having different resistances. FIG. 1 schematically shows an example shape of the static electricity blocking unit LP, the description of which will be given later on herein.

The cover case EDC may be coupled to the window layer WM. The cover case EDC may provide a back surface of the display device EA. The cover case EDC may be coupled to the window layer WM and may provide an internal space. The components of the display module DU may be disposed inside the internal space. The cover case EDC may include a material having a predetermined rigidity. For example, the cover case EDC may include a plurality of frames and/or plates made of glass, plastic, and/or metal. The cover case EDC may protect the components of the display device EA disposed inside the internal space from external impact.

Figure 2:
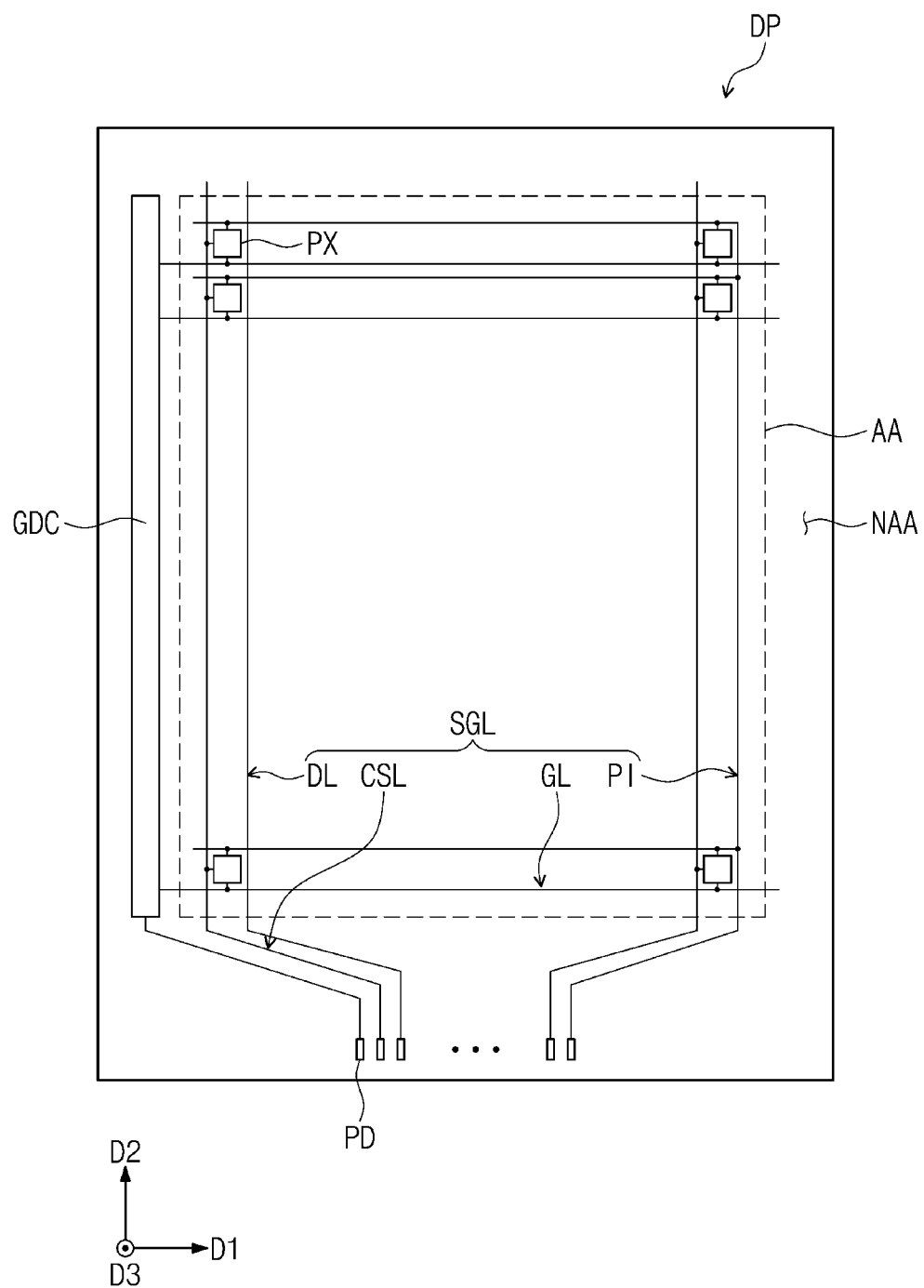
FIG. 2 is a plan view illustrating a display panel according to an exemplary embodiment of the present inventive concept.

FIG. 2 is a plan view illustrating a display panel according to an exemplary embodiment of the present inventive concept.

Referring to FIG. 2 the display panel DP according to an exemplary embodiment of the present inventive concept may include the active area AA and the peripheral area NAA. According to an exemplary embodiment of the present inventive concept, the peripheral area NAA may have a closed line shape surrounding the active area AA. The active area AA and the peripheral area NAA of the display panel DP may be regions disposed on a base layer BS (shown in FIG. 5A) of the display panel DP.

The display panel DP may include a driving circuit GDC, a plurality of signal lines SGL, a plurality of pixels PX, and a plurality of pads PD. The pixels PX are disposed in the active area AA. Each of the pixels PX may include an organic light emitting element and a pixel driving circuit connected thereto. The driving circuit GDC, the signal lines SGL, and the pixel driving circuit may be included in a circuit element layer CL.

The driving circuit GDC may include a scan driving circuit. The scan driving circuit generates a plurality of scan signals, and sequentially outputs the scan signals to a plurality of scan lines GL to be described later. The scan driving circuit may further output another control signal to a driving circuit of the pixels PX. The driving circuit GDC may be formed in a same process as that of the driving circuit of the pixels PX.

The signal lines SGL may include the scan lines GL, data lines DL, a power line PI, and a control signal line CSL. Each of the scan lines GL may be connected to a corresponding pixel PX among the plurality of pixels PX, and each of the data lines DL may be connected to a corresponding pixel PX among the plurality of pixels PX. The power line PI is connected to the pixels PX. The control signal line CSL may provide control signals to the scan driving circuit.

The signal lines SGL may be connected to a circuit board. The signal lines SGL may be connected to a timing control circuit in the form of an integrated chip mounted on the circuit board. However, the present inventive concept is not limited thereto. According to an exemplary embodiment of the present inventive concept, the integrated chip may be disposed in the peripheral area NAA and connected to the signal lines SGL.

The pads PD may be connected to corresponding signal lines SGL and connected to a flexible printed circuit board on which driving chips may be mounted. Each of the signal lines SGL may transmit/receive data provided from the flexible printed circuit board through the corresponding pads PD.

Figure 3:
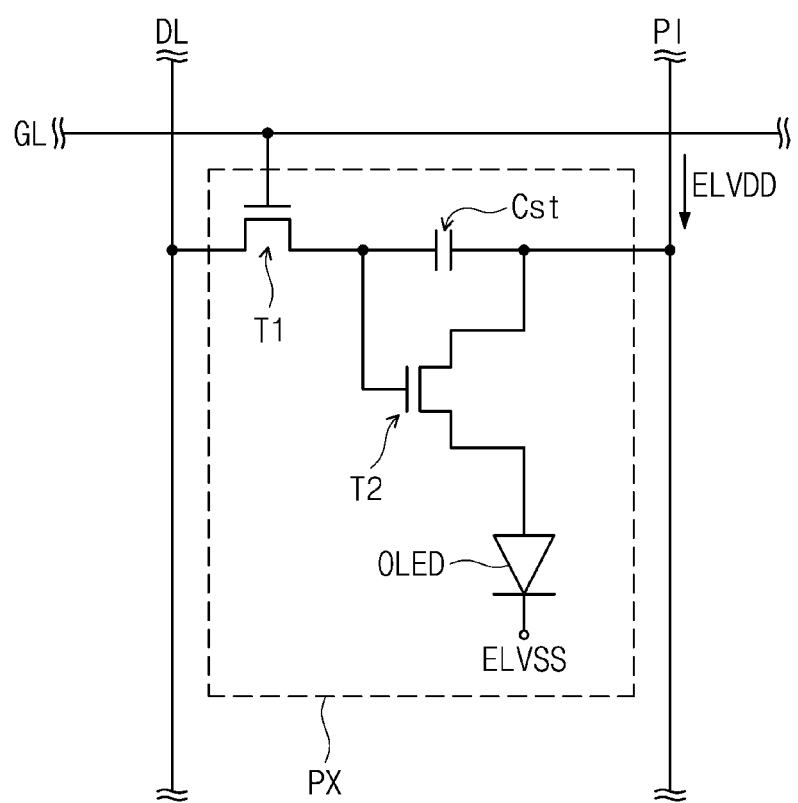
FIG. 3 is an equivalent circuit diagram illustrating a pixel included in a display device according to an exemplary embodiment of the inventive concept.

FIG. 3 is an equivalent circuit diagram illustrating a pixel included in a display device according to an exemplary embodiment of the inventive concept.

FIG. 3 shows one scan line GL, one data line DL, the power line PI, and the pixel PX connected thereto. However, the configuration of the pixel PX as included in a display panel DP in accordance with the present inventive concept is not limited to the precise embodiment illustrated in FIG. 3, and may be variously modified.

Referring to FIG. 3, the pixel PX may include a first transistor T1 (or a switching transistor), a second transistor T2 (or a driving transistor), and a capacitor Cst as a pixel driving circuit for driving an organic light emitting diode OLED. The second transistor T2 may be provided with a first power voltage ELVDD through the power line PI, and the organic light emitting diode OLED may be provided with a second power voltage ELVSS through the power line PI. The second power voltage ELVSS may be a voltage lower than the first power voltage ELVDD.

The first transistor T1 outputs a data signal applied to the data line DL in response to a scan signal applied to the scan line GL. The capacitor Cst charges a voltage corresponding to the data signal received from the first transistor T1. The second transistor T2 may be connected to the organic light emitting diode OLED. The second transistor T2 controls a driving current flowing in the organic light emitting diode OLED in accordance with the amount of charge stored in the capacitor Cst.

The pixel PX may further include a plurality of transistors and may include a larger number of capacitors. The organic light emitting diode OLED may be connected between the power line PI and the second transistor T2.

Figure 4:
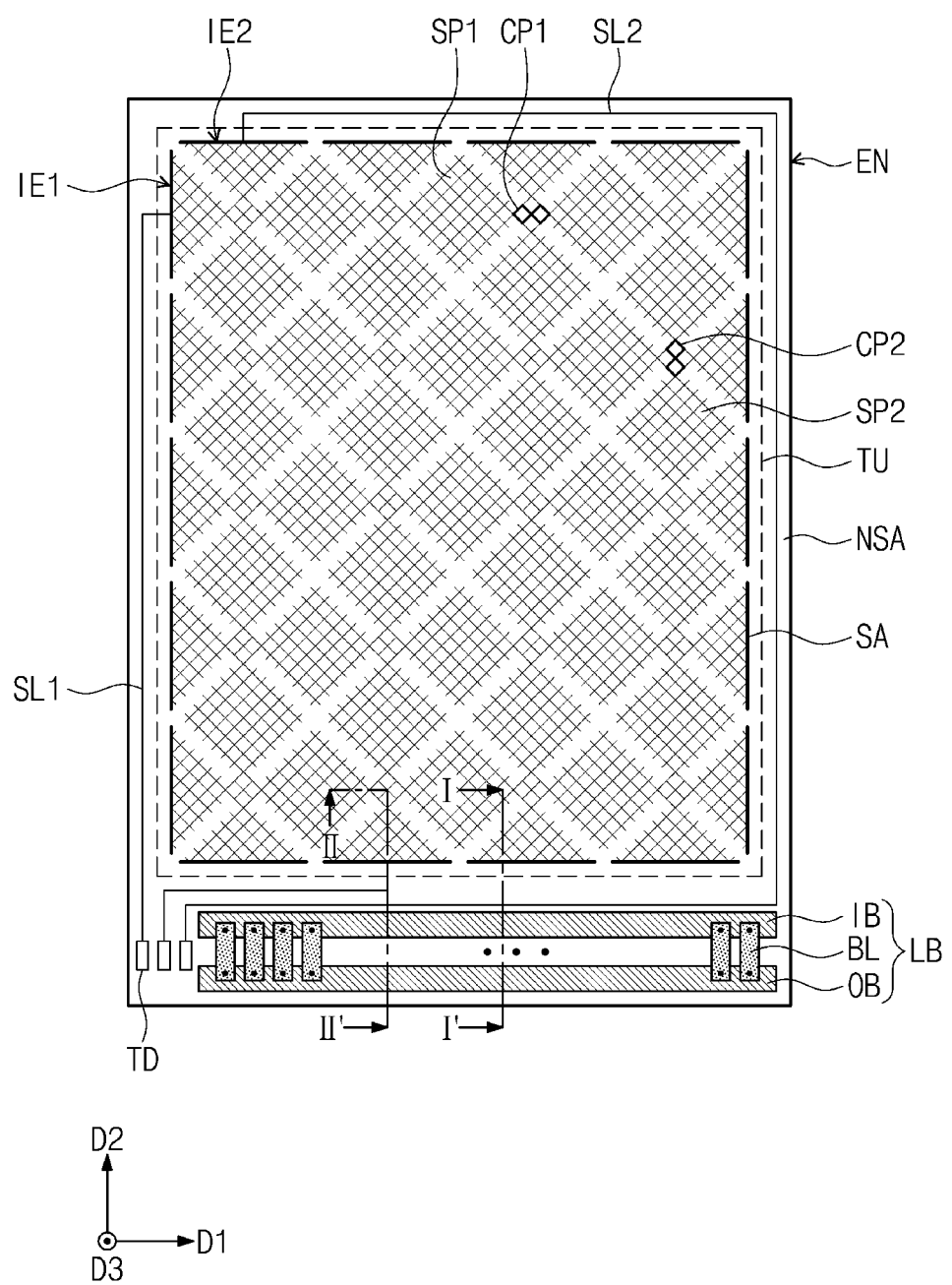
FIG. 4 is a plan view illustrating an input sensing layer included in a display device according to an exemplary embodiment of the present inventive concept.

FIG. 4 is a plan view illustrating an input sensing layer included in a display device according to an exemplary embodiment of the present inventive concept.

Referring to FIG. 4, the input sensing layer TU according to an exemplary embodiment of the present inventive concept may be disposed on the display panel DP. For example, the input sensing layer TU is disposed on the encapsulation substrate EN. The input sensing layer TU may be disposed directly on the encapsulation substrate EN. The input sensing layer TU may be formed on the encapsulation substrate EN through a continuous process after the encapsulation substrate EN is formed. Accordingly, a separate adhesive layer disposed between the input sensing layer TU and the encapsulation substrate EN may be omitted.

The input sensing layer TU may sense an input applied from the outside. The input applied from the outside may be provided in various forms. For example, the input may include not only a contact by a part of a user's body, such as a hand, but also an external input applied in close proximity, or adjacent to the display device EA at a predetermined distance (for example, hovering). Also, the external input may have various forms such as force, pressure, and light, but is not limited thereto.

The input sensing layer TU may include a sensing area SA overlapping the active area AA of the display panel DP and a non-sensing area NSA adjacent to the sensing area SA. The sensing area SA may be a region in which an input applied from the outside is sensed.

Figure 5A:
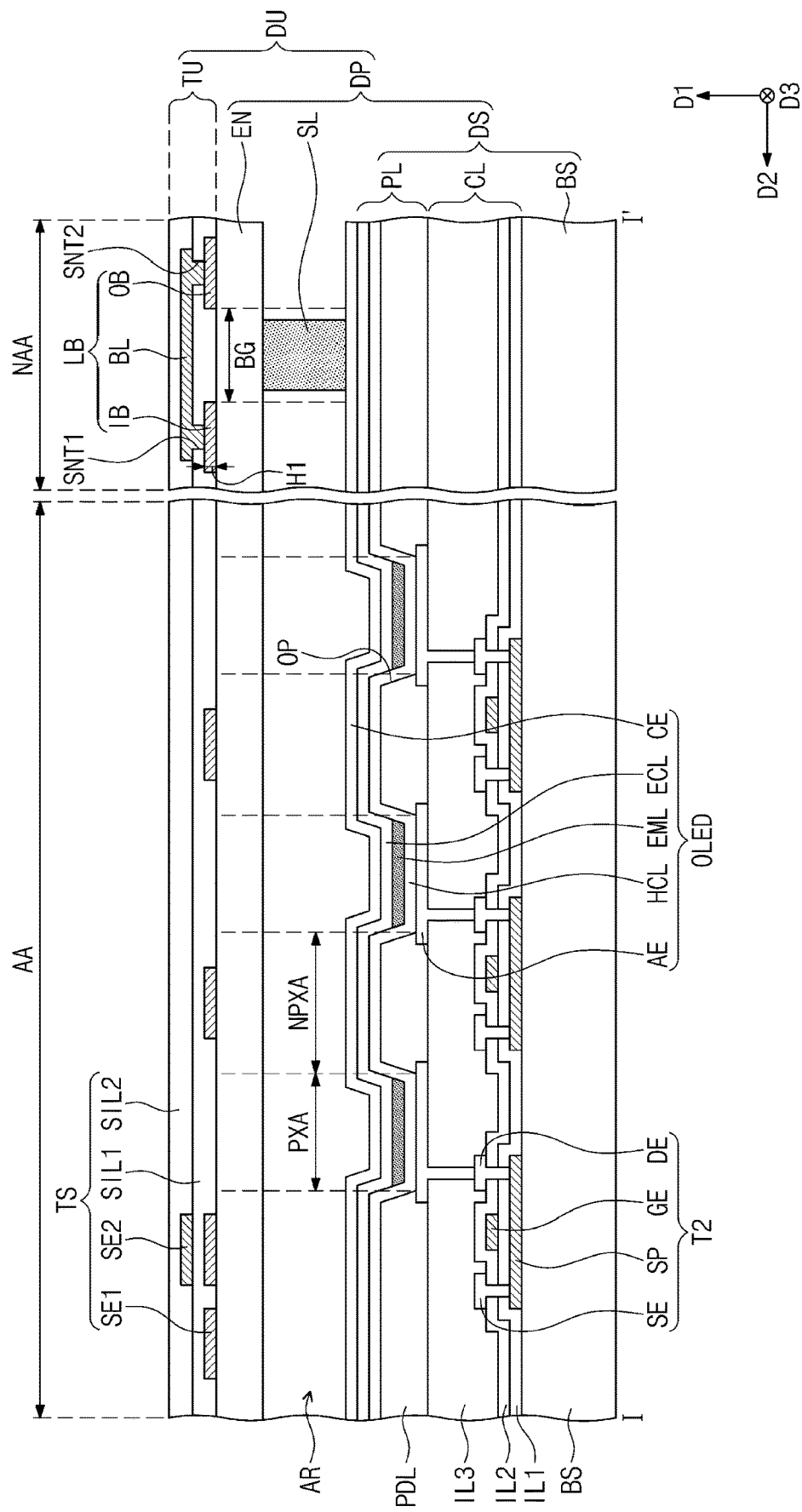
FIG. 5A is a cross-sectional view illustrating a cross-section taken along line of the display device illustrated in FIG. 4.

The input sensing layer TU may include the sensing sensor including a plurality of conductive layers and a plurality of sensing insulation layers SIL1 and SIL2 disposed between the conductive layers (shown e.g., in FIG. 5A). Each of the sensing insulation layers SIL1 and SIL2 may have a single-layered structure, or a multi-layered structure laminated along a third direction D3. For example, the sensing insulation layers SIL1 and SIL2 may cover the sensing sensors disposed in a respective layer.

The conductive layers may include first sensing electrodes IE1, first signal lines SL1 connected to the first sensing electrodes IE1, second sensing electrodes IE2, and second signal lines SL2 connected to the second sensing electrodes IE2. Also, the conductive layers may include sensing pads TD connected to the first signal lines SL1 and the second signal lines SL2.

According to an exemplary embodiment of the present inventive concept, the first sensing electrodes IE1 and the second sensing electrodes IE2 may at least partially overlap the sensing area SA, and the first signal lines SL1, the second signal lines SL2, and the sensing pads TD may at least partially overlap the non-sensing area NSA. The sensing pads TD may be connected to the flexible printed circuit board on which the driving chips are mounted. Each of the first signal lines SL1 and the second signal lines SL2 may transmit/receive data provided from the flexible printed circuit board through the corresponding sensing pads TD to provide data to the corresponding first sensing electrodes IE1 and/or the corresponding second sensing electrodes IE2.

The first sensing electrodes IE1 and the second sensing electrodes IE2 may cross each other. The first sensing electrodes IE1 may be arranged along a second direction (e.g., a D2 direction), and each may extend along a first direction (e.g., a D1 direction). For example, the first sensing electrodes IE1 may be arranged in rows extending in the first direction D1 and spaced apart from one another in the second direction D2. Each of the first sensing electrodes IE1 may include first sensor units SN and first connection pans CP1.

The first connection pans CP1 may connect different first sensor units SP1 arranged along the first direction (e.g., the D1 direction). According to an exemplary embodiment of the present inventive concept, the first connection parts CN may be disposed on a different layer from the first sensing units SP1 with a sensing insulation layer interposed therebetween.

The second sensing electrodes IE2 are arranged along the first direction (e.g., the D1 direction), and may each extend along the second direction (e.g., the D2 direction). For example, the second sensing electrodes IE2 may be arranged in columns extending in the second direction D2 and spaced apart from one another in the first direction D1. Each of the second sensing electrodes IE2 may include second sensor units SP2 and second connection parts CP2.

The second connection parts CP2 may connect different second sensor units SP2 arranged along the second direction (e.g., the D2 direction). A portion of each of the second connection parts CP2 may at least partially overlap a corresponding first connection part among the first connection parts CP1. According to an exemplary embodiment of the present inventive concept the second connection parts CP2 may be disposed on a different layer from the first sensing units SP1 with a sensing insulation layer interposed therebetween. Also, the second connection parts CP2 may be disposed on the same layer as the first sensing electrodes IE1 and the second sensing electrodes IE2.

According to an exemplary embodiment of the present inventive concept, each of the first sensing electrodes IE1 and the second sensing electrodes IE2 may include mesh lines. Accordingly, each of the first sensor units SP1 and the first connection parts CP1 included in the first sensing electrodes IE1 may include mesh lines, and each of the second sensor units SP2 and the second connection parts CP2 included in the second sensing electrodes IE2 may include mesh lines.

Since the first sensing electrodes IE1 and the second sensing electrodes IE2 may each include mesh lines, parasitic capacitance with a second electrode CE (see FIG. 5A) of the organic light emitting diode OLED may be reduced.

The input sensing layer TU may sense an external input by a mutual cap method or a self-cap method. For example, the input sensing layer TU may calculate coordinates of an external input either by the mutual cap method or the self-cap method during a first interval and recalculate coordinates of the external input by a different method during a second interval. Also, as described later on herein, since the mesh lines of each of the first sensing electrodes IE1 and the second sensing electrodes IE2 do not overlap a light emitting area PXA (see FIG. 5A), the sensing sensor of the input sensing layer TU is not visible to the user.

According to an exemplary embodiment of the present inventive concept, the static electricity blocking unit LB may be disposed apart from the sensing sensor of the input sensing layer TU. The static electricity blocking unit LB may be spaced apart from the first sensing electrodes IE1, the first signal lines SL1, the second sensing electrodes IE2, the second signal lines SL2, and the sensing pads TD included in the sensing sensor. For example, the static electricity blocking unit LB may be disposed at an edge region of the display substrate DS and may have long sides that extend in the first direction (e.g., the D1 direction) and short sides that extend in the second direction (e.g., the D2 direction). The sensing pads TD may be disposed adjacent to a short side of the static electricity blocking unit LB at a same edge region of the display substrate DS. Accordingly, since static electricity introduced from the outside is offset through the static electricity blocking unit LB, the input sensing layer TU may be provided with increased reliability. A second signal line SL2 may extend in the first direction (e.g., the D1 direction) and may include a segment that at least partially overlaps a side surface of the static electricity blocking unit LB. According to an exemplary embodiment of the present inventive concept, an additional signal line may be disposed between the segment of the second signal SL2 and the input sensing layer TU and may connect to a second sensing electrode IE2 disposed adjacent to the static electricity blocking unit LB. The additional signal line may have a first segment that extends substantially in the first direction (e.g., the D1 direction) and at least partially overlaps the second signal line SL2 and the static electricity blocking unit LB, and may include a second segment that is substantially perpendicular to the first segment (e.g., extends in the D2 direction) and connects to the second sensing electrode IE2.

FIG. 5A is a cross-sectional view illustrating a cross-section taken along; I-I' of the display device illustrated in FIG. 4.

Referring to the exemplary embodiment of the present inventive concept illustrated in FIG. 5A, the display module DU includes the display panel DP and the input sensing layer TU. The display panel DP may include the display substrate DS, a sealing unit SL, and the encapsulation substrate EN. The display substrate DS may include the base layer BS, the circuit element layer CL, and a display element layer PL.

The base layer BS may be a base layer on which components of the circuit element layer CL and the display element layer PL may be formed. The base layer BS may include a glass substrate, a metal substrate, and/or an organic/inorganic composite material substrate. In addition, the base layer BS may include a synthetic resin film. A synthetic resin layer may include a thermosetting resin.

The base layer BS may include a barrier layer and/or a buffer layer disposed thereon, which are inorganic layers. The base layer BS may include at least one of aluminum oxide ($AlO_X$), titanium oxide ($TiO_X$), silicon oxide ($SiO_X$), silicon oxynitride ($SiN_XO_Y$), zirconium oxide ($ZnO_X$), and hafnium oxide ($HfO_X$). The inorganic layer may be formed as a multi-layered inorganic layer. The multi-layered inorganic layers may constitute the barrier layer and/or the butler layer. The barrier layer and the buffer layer may be selectively disposed.

The barrier layer prevents foreign substances from being introduced from the outside. The barrier layer may include a silicon oxide layer and/or a silicon nitride layer. According to an exemplary embodiment of the present inventive concept, the silicon oxide layer and the silicon nitride layer may be alternately laminated.

The buffer layer increases adhesion force among components disposed on or under the buffer layers. The buffer layer may include a silicon oxide layer and/or a silicon nitride layer. According to an exemplary embodiment of the present inventive concept, the silicon oxide layer and the silicon nitride layer may be alternately laminated.

The circuit element layer CL may include the second transistor T2 and a plurality a insulation layers IL1, IL2, and IL3. Of the transistors T1 and T2 described with reference to FIG. 3, FIG. 5A shows only the second transistor T2 corresponding to the driving transistor.

The second transistor T2 may include a semiconductor pattern SP, a control electrode GE, an input electrode SE, and an output electrode DE. The semiconductor pattern SP may be disposed on the base layer BS. The semiconductor pattern SP may include a crystalline semiconductor material and/or amorphous silicon.

The first insulation layer IL1 may be disposed on the base layer BS. The first insulation layer IL1 may overlap each of the pixels PX, and covers the semiconductor pattern SP of each of the pixels PX. The first insulation layer IL1 may be an inorganic layer and/or organic layer, and may have a single-layered structure or a multi-layered structure. The first insulation layer IL1 may include at least one of aluminum oxide ($AlO_X$), titanium oxide ($TiO_X$), silicon oxide ($SiO_X$), silicon ox nitride ($SiN_XO_Y$), zirconium oxide ($ZnO_X$) and/or hafnium oxide ($HfO_X$).

The control electrode GE may be disposed on the first insulation layer IL1. The control electrode GE may overlap the semiconductor pattern SP.

The second insulation layer IL2 may be disposed on the first insulation layer IL1. The second insulation layer IL2 may cover the first insulation layer IL1 and the control electrode GE. The second insulation layer IL2 may overlap each of the pixels PX. The second insulation layer IL2 may be an inorganic layer and/or an organic layer, and may have a single-layered structure or a multi-layered structure. The second insulation layer IL2 may include at least one of aluminum oxide ($AlO_X$), titanium oxide ($TiO_X$), silicon oxide ($SiO_X$), silicon oxynitride ($SiN_XO_Y$), zirconium oxide ($ZnO_X$), and/or hafnium oxide ($HfO_X$).

The input electrode SE and the output electrode DE may be disposed on the second insulation layer IL2. Each of the input electrode SE and the output electrode DE may be connected to the semiconductor pattern SP through a plurality of contact holes defined in the first insulation layer IL1 and opening unto the second insulation layer IL2.

The third insulation layer IL3 may be disposed on the second insulation layer IL2. The third insulation layer IL3 may cover the second transistor T2. The third insulation layer IL3 may be an inorganic layer and/or an organic layer, and may have a single-layered structure or a multi-layered structure. The third insulation layer IL3 may include at least one of aluminum oxide ($AlO_x$), titanium oxide ($TiO_x$), silicon oxide ($SiO_x$), silicon oxynitride ($SiN_xO_y$), zirconium oxide ($ZnO_x$), and/or hafnium oxide ($HfO_x$).

In FIG. 5A, the structure of the second transistor T2 is illustrated as that of a top gate transistor, but the present inventive concept is not limited thereto. For example, a transistor having a different structure, such as a bottom gate transistor, may be provided.

The display element layer PL may include the organic light emitting diode OLED and a pixel definition film PDL. The organic light emitting diode OLED may be disposed on the third insulation layer IL3. The organic light emitting diode OLED may include a first electrode AE, a first charge control layer HCL, a light emitting layer EML, a second charge control layer ECL, and a second electrode CE. The first electrode AE, the first charge control layer HCL, the light emitting layer EML, the second charge control layer ECL, and the second electrode CE may respectively correspond to an anode electrode AE, a hole control layer HCL, the light emitting layer EML, an electron control layer ECL, and a cathode electrode CE.

The first electrode AE may be disposed on the third insulation layer IL3. The first electrode AE may be connected to the output electrode DE through a contact hole passing through the third insulation layer IL3.

The pixel definition film PDL may be disposed on the third insulation layer IL3. An opening OP may be provided in the pixel definition film PDL and expose at least a portion of the first electrode AE. The opening OP of the pixel definition film PDL may define the light emitting area PXA of the pixel PX. The pixel PX may include the organic light emitting diode OLED and the driving transistor T2. On the base layer BS, a region on which the pixels PX are disposed may be referred to as the active area AA, and the active area AA may include the light emitting area PXA and non-light emitting area NPXA adjacent to the light emitting area PXA. The non-light emitting area NPXA may at least partially surround the light emitting area PXA.

The first charge control layer HCL may be disposed in the light emitting area PXA and the non-light emitting area NPXA. A common layer such as the first charge control layer HCL may be formed in the plurality of pixels PX. The first charge control layer HCL may control the movement of holes. For example, the first charge control layer HCL may include a hole transport layer and a hole injection layer.

The light emitting layer EML may be disposed on the first charge control layer HCL. The light emitting layer EML may be disposed only in a region corresponding to the opening OP. The light emitting layer EML may be formed in each of the plurality of pixels PX in respective openings OP.

The second charge control layer ECL may be disposed on an upper surface of the light emitting layer EML. The second charge control layer ECL may control the movement of electrons. For example, the second charge control layer ECL may include an electron transport layer and an electron injection layer.

The second electrode CE may be disposed on the second charge control layer ECL. The second electrode CE may be a common electrode or a negative electrode. The second electrode CE may be disposed in the light emitting area PXA and the non-light emitting area NPXA. A common layer such as the second electrode CE may be formed in the plurality of pixels PX.

When the organic light emitting diode OLED is a top emission type light emitting diode, the first electrode AE may be a reflective electrode, and the second electrode CE may be a transmissive electrode, or a transflective electrode. When the organic light emitting diode OLED is a bottom emission type light emitting diode, the first electrode AE may be a transmissive electrode or a transflective electrode, and the second electrode CE may be a reflective electrode.

The encapsulation substrate EN may be disposed on the display substrate DS. The encapsulation substrate EN may at least partially cover a display area DA. The encapsulation substrate EN may be provided as a substrate made of glass and/or plastic. However, the present inventive concept is not limited thereto. For example, the encapsulation substrate EN may include an organic film and/or an inorganic film.

The display substrate DS and the encapsulation substrate EN may be bonded by the sealing unit SL. The sealing unit SL may be disposed at an edge of the encapsulation substrate EN. According to an exemplary embodiment of the present inventive concept, the edge may refer to the outer periphery of the encapsulation substrate EN overlapping the peripheral area NAA of the display substrate DS. Accordingly, the sealing unit SL may overlap the peripheral area NAA of the display substrate DS. The sealing unit SL may include frit. The sealing unit SL may block the organic light emitting diode OLED from being exposed to external moisture and air together with the encapsulation substrate EN.

The sealing unit SL disposed between the display substrate DS and the encapsulation substrate EN may have a predetermined thickness. Accordingly, an internal space AR may be formed by the display substrate DS, the encapsulation substrate EN, and the sealing unit SL. The internal space AR may be a vacuum. However, the present inventive concept is not limited thereto. For example, the internal space AR may be filled with nitrogen ($N_2$), and/or with an insulation material.

In FIG. 5A, the sealing unit SL is shown to be disposed on the second electrode CE of the organic light emitting diode OLED, but the present inventive concept is not limited thereto. For example, an insulation layer including an inorganic and/or organic material may at least partially cover the second electrode CE, and the sealing unit SL may be disposed on the insulation layer covering the second electrode CE. According to an exemplary embodiment of the present inventive concept, the pixel definition fila PDL and the insulation layers IL1, IL2, and IL3 may be omitted in a region corresponding to the peripheral area NAA, and the sealing unit SL may be disposed directly on the base layer BS.

The input sensing layer TU may be disposed on the encapsulation substrate EN. According to an exemplary embodiment of the present inventive concept, the input sensing layer TU may include a first conductive layer SE1, a second conductive layer SE2, a first sensing insulation layer SIL1, and a second sensing insulation layer SIL2.

The first conductive layer SE1 may be disposed on the encapsulation substrate EN. The first conductive layer SE1 may be disposed directly on the encapsulation substrate EN. The first conductive layer SE1 may be a layer including at least one of the first sensing electrodes IE1 and the second sensing electrodes IE2. The first conductive layer SE1 may include mesh lines. The first conductive layer SE1 does not overlap the lulu emitting area PXA.

The first conductive layer SE1 may include a conductive material. For example, the first conductive layer SE1 may include molybdenum (Mo), molybdenum oxide (MoOx), molybdenum niobium (MoNb), APC (Ag—Pd—Cu) alloy, nickel (Ni), copper (Cu), and/or an alloy thereof.

The first sensing insulation layer SIL1 may be disposed on the encapsulation substrate EN. The first sensing insulation layer SIL1 may cover the first conductive layer SE1. The first sensing insulation layer SIL1 may be an inorganic layer and/or an organic layer, and may have a single-layered structure or a multi-layered structure. The first sensing insulation layer SIL1 may include at least one of aluminum oxide ($AlO_X$), titanium oxide ($TiO_X$), oxide ($SiO_X$), silicon oxynitride ($SiN_XO_Y$), zirconium oxide ($ZnO_X$), and/or hafnium oxide ($HfO_X$).

The second conductive layer SE2 may be disposed on the first sensing insulation layer SIL1. The second conductive layer SE2 may be a layer including at least one of the first sensing electrodes IE1 and the second sensing electrodes IE2. The second conductive layer SE2 may include mesh lines. Accordingly, the second conductive layer SE2 does not overlap the light emitting area PXA.

The second conductive layer SE2 may be disposed on a different layer from the first conductive layer SE1 with the first sensing insulation layer SIL1 interposed therebetween. The second conductive layer SE2 may overlap the first conductive layer SE1 on a plane (e.g., a plane parallel to an axis of the second direction D2), and may be spaced apart from each other.

The second conductive layer SE2 may include a transparent conductive material. For example, the second conductive layer SE2 may include indium tin oxide, indium zinc oxide, indium gallium zinc oxide, fluorine zinc oxide, gallium zinc oxide, and/or tin oxide. In addition, the transparent conductive layer may include a conductive polymer, a metal nanowire, and/or graphene.

The second sensing insulation layer SIL2 may be disposed on the first sensing insulation layer SIL1. The second sensing insulation layer SIL2 may cover the second conductive layer SE2. The second sensing insulation layer SIL2 may be an inorganic layer and/or an organic layer, and may have a single-layered structure or a multi-layered structure. The second sensing insulation layer SIL2 may include aluminum oxide ($AlO_X$), titanium oxide ($TiO_X$), silicon oxide ($SiO_X$), silicon oxynitride ($SiN_XO_Y$), zirconium oxide ($ZnO_X$), and/or hafnium oxide ($HfO_X$).

The sensing insulation layers SIL1 and SIL2 of the input sensing layer TU may cover the entire surface of the encapsulation substrate EN. Accordingly, the sensing insulation layers SIL1 and SIL2 may cover both the active area AA and the peripheral area NAA. Referring back to FIG. 1, the portions of the sensing insulation layers SIL1 and SIL2 that may be disposed on the peripheral area NAA are omitted for ease of description, and the input sensing layer TU comprising sensing insulation layers SIL1 and SIL2 is shown as an undivided layer.

The static electricity blocking unit LB according to an exemplary embodiment of the present inventive concept may include a first blocking pattern IB, a second blocking pattern OB, and a connection pattern BL.

The first blocking pattern IB and the second blocking pattern OB may be disposed on the encapsulation substrate EN. The first blocking pattern IB and the second blocking pattern OB according to an exemplary embodiment of the present inventive concept may be disposed directly on the encapsulation substrate EN. The first blocking pattern IB and the second blocking pattern OB may overlap the peripheral area NAA. The first blocking pattern IB and the second blocking pattern OB may be disposed on the same layer spaced apart from each other. Accordingly, the first blocking pattern IB and the second blocking pattern OB may have a predetermined separation space BG. The first blocking pattern IB may be disposed closer to the active area AA relative to the second blocking pattern OB.

According to an exemplary embodiment of the present inventive concept, the first blocking pattern IB and the second blocking pattern IB may be disposed in a same layer as the first conductive layer SE1. The first blocking pattern IB and the second blocking pattern OB may be covered by the first sensing insulation layer SIL1 of the input sensing layer TU.

At least one of the first blocking pattern IB and the second blocking pattern OB may include the same conductive material as the first conductive layer SE1. For example, at least one of the first blocking pattern IB and the second blocking pattern OB may include molybdenum (Mo), molybdenum oxide (MoOx), molybdenum niobium (MoNb), APC (Ag—Pd—Cu)) alloy, nickel (Ni), copper (Cu), and/or an alloy thereof.

The connection pattern BL may be disposed on the first sensing insulation layer STL1. The connection pattern BL may overlap the peripheral area NAA. The connection pattern BL may be connected to the first blocking pattern IB and the second blocking pattern OB by contact holes SNT1 and SNT2 formed in the first sensing insulation layer SIL1.

The connection pattern BL may include the same conductive material as the second conductive layer SE2, such as a transparent conductive material. For example, the connection pattern BL may include indium tin oxide, indium zinc oxide, indium gallium zinc oxide, fluorine zinc oxide, gallium zinc oxide, and/or tin oxide. In addition, the transparent conductive layer may include a conductive polymer, a metal nanowire, and/or graphene.

At least a portion of the sealing unit SL according to an exemplary embodiment of the present inventive concept may overlap the separation space BG formed between the first blocking pattern IB and the second blocking pattern OB on a plane. The sealing unit SL may at least partially overlap the connection pattern BL viewed from a cross section.

Figure 5B:
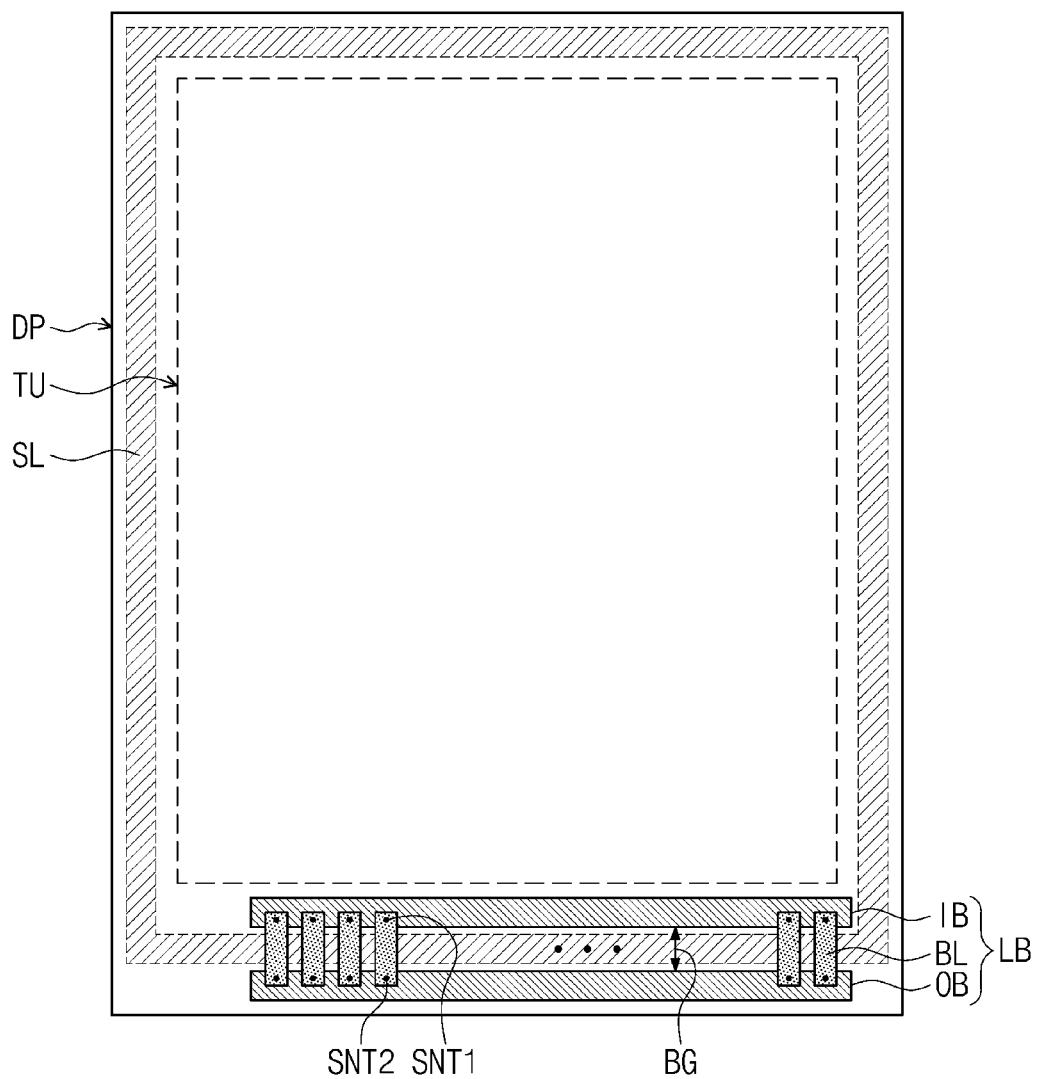
FIG. 5B is a plan view illustrating a configuration of a display device according to an exemplary embodiment of the present inventive concept.

FIG. 5B is a plan view illustrating a configuration of a display device according to an exemplary embodiment of the present inventive concept.

Referring to FIG. 5B, the sealing unit SL disposed between the display substrate DS of the display panel OP and the encapsulation substrate EN is illustrated as shaded. The input sensing layer TU disposed on the display panel DP is marked with dotted lines.

The sealing unit SL may extend along an edge of the encapsulation substrate EN and bonds the display substrate DS and the encapsulation substrate EN. According to an exemplary embodiment of the present inventive concept, one side of the sealing unit SL may overlap the separation space BG formed between the first blocking pattern IB and the second blocking pattern OB on a plane.

The connection pattern BL extends in the second direction (e.g., the D2 direction) and is disposed overlapping the separation space BG. The connection pattern BL is connected to the first blocking pattern IB and the second blocking pattern OB through the contact holes SNT1 and SNT2 formed in the first sensing insulation layer SIL1. For example, the connection pattern BL may include a first and second portion respectively occupying the contact holes SNT1 and SNT2. The connection pattern BL may be provided in plurality. The connection patterns BL provided in plurality may be arranged in the first direction (e.g., the D1 direction) spaced apart from each other, and may include a length that extends in the second direction (e.g., the D2 direction). Accordingly, the sealing unit SL may be disposed overlapping the connection pattern BL.

After the second sensing insulation layer SIL3 of the input sensing layer TU is formed, the sealing unit SL exposed by the separation space BG between the first blocking pattern IB and the second blocking pattern OB may be irradiated with a laser during a curing process. Depending upon the area of a region irradiated by the laser, the sealing unit SL may protrude in a direction toward the active area AA and/or in a direction toward the edge of the display substrate DS. Accordingly, unnecessary space occupied by the sealing unit SL may occur. In order to provide a slim peripheral area NAA, a configuration for controlling the area of the laser used to irradiate the sealing unit SL is required.

According to an exemplary embodiment of the inventive concept, the first blocking pattern IB and the second blocking pattern OB disposed with the sealing unit SL interposed therebetween may be included. By variously controlling the width of the separation space BG formed between the first blocking pattern IB and the second blocking pattern OB according to the width of the sealing unit SL, the area of the laser used to irradiate the sealing unit SL may be controlled. Accordingly, by preventing the generation of unnecessary space caused by the protrusion of the sealing unit SL caused by a curing process, a display device including a slim peripheral area NAA is provided.

The connection pattern BL may be disposed overlapping the sealing unit SL. Accordingly, when the sealing unit SL is cured, laser is irradiated on the connection pattern BL, which may affect the curing of the sealing unit SL. However, according to the inventive concept, the connection pattern BL may include a transparent conductive material having high transmittance, so that the connection pattern BL might not affect the laser light directed at the sealing unit SL.

According to an exemplary embodiment of the present inventive concept, at least one of the first blocking pattern IB and the second blocking pattern OB may have a first resistance, and the connection pattern BL may have a second resistance which may be different from the first resistance. According to an exemplary embodiment of the present inventive concept, the first resistance may be smaller than the second resistance. For example, when the first blocking pattern IB includes molybdenum niobium (MoNb), the first resistance may be 0.76Ω. When the second blocking pattern OB includes indium tin oxide, the second resistance may be 50.08Ω.

The static electricity blocking unit LB according to an exemplary embodiment of the present inventive concept may provide a path through which static electricity introduced from the outside passes. For example, when static electricity is introduced to the input sensing layer TU via the static electricity blocking unit LB, the static electricity passes through the second blocking pattern OB to pass through the first blocking pattern IB that may have a higher resistance than the second blocking pattern OB. At this time, the static electricity is offset by traveling along a path connected in sequence to the second blocking pattern OB, a second contact hole SNT2, the connection pattern BL, a first contact hole SNT1, and the first blocking pattern IB.

According to an exemplary embodiment of the present inventive concept, static electricity is gradually offset in the connection pattern BL and the contact holes SNT1 and SNT2 having relatively high resistance. Accordingly, components of the input sensing layer TU may be efficiently protected from static electricity, so that the input sensing layer TU with increased reliability may be provided.

The static electricity blocking unit LB may be disposed on the encapsulation substrate EN coupled to the display substrate DS by the sealing unit SL, but the present inventive concept is not limited thereto. For example, the static electricity blocking unit LB according to an exemplary embodiment of the present inventive concept may be disposed on an encapsulation layer.

The encapsulation layer may be a sealing layer which blocks the introduction of moisture and oxygen to the display substrate DS, and may include a plurality of inorganic films and at least one organic film disposed between the inorganic films.

When the encapsulation layer is used as a base layer on which the input sensing layer TU is formed, the static electricity blocking unit LB may be disposed on the encapsulation layer.

Figure 5C:
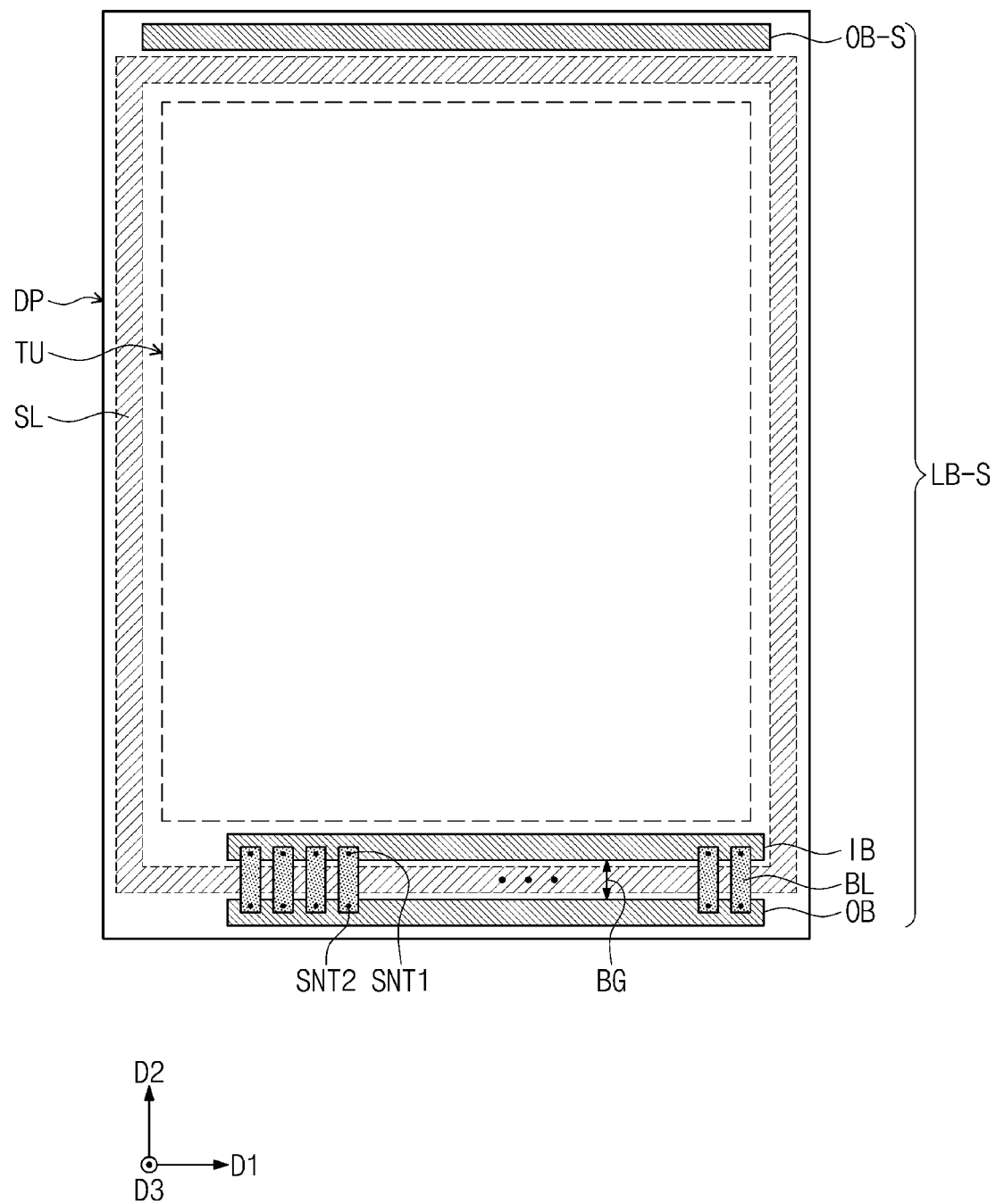
FIG. 5C is a plan view illustrating a display device according to an exemplary embodiment of the present inventive concept.

FIG. 5C is a plan view illustrating a display device according to an exemplary embodiment of the present inventive concept.

Referring to FIG. 5C, a static electricity blocking unit LB-S according to an exemplary embodiment of the present inventive concept may further include an additional blocking pattern OB-S. The additional blocking pattern OB-S may be disposed apart from the second blocking pattern OS with the input sensing layer TU interposed therebetween. The first blocking pattern IB and the second blocking pattern OB may be disposed at a first side of the input sensing layer TU, for example, with a width parallel to an axis of the second direction (e.g., a D2 direction). The additional blocking pattern OB-S may be disposed on a second side of the input sensing layer TU, for example, a side opposite to the first blocking pattern IB and the second blocking pattern OB with a width parallel to an axis of the second direction (e.g., the D2 direction). The additional blocking pattern OB-S may block static electricity introduced to an upper portion of the input sensing layer TU, as viewed from a plan view.

The additional blocking pattern OB-S according to an exemplary embodiment of the present inventive concept may be disposed on the same layer as the second blocking pattern OB. The additional blocking pattern OB-S may include the same material as the second blocking pattern OB. For example, the additional blocking pattern OB-S may include molybdenum (Mo), molybdenum oxide (MoOx), molybdenum niobium (MoNb), APC (Ag—Pd—Cu) alloy, nickel (Ni), copper (Cu), and/or an alloy thereof.

Figure 6A:
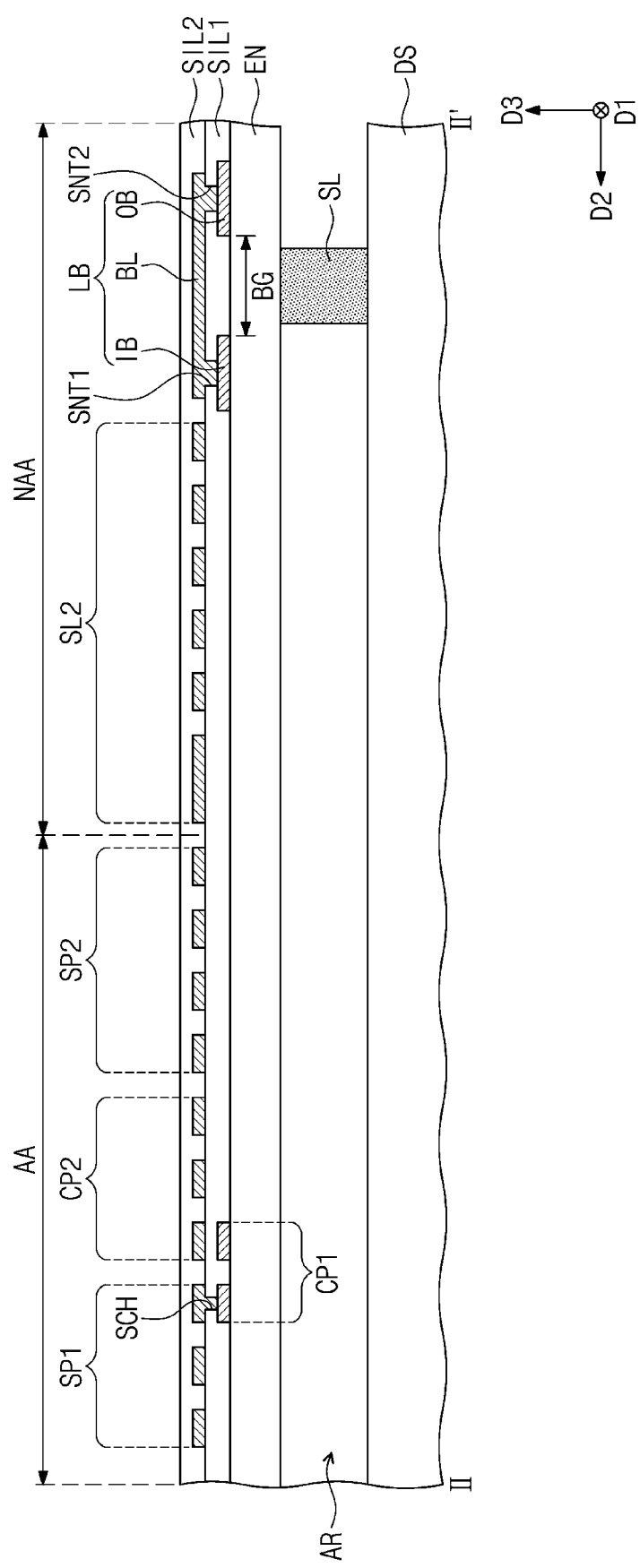
FIG. 6A is a cross-sectional view illustrating a cross-section taken along line II-II' of the display device shown in FIG. 4, according to an exemplary embodiment of the present inventive concept.

FIG. 6A is a cross-sectional view illustrating a cross-section taken along line II-II' of the display device shown in FIG. 4 according to an exemplary embodiment of the present inventive concept. FIG. 6A shows the configuration of the input sensing layer TU corresponding to a cross section taken along line II-II' of FIG. 4 between the conductive layers SE1 and SE2 described with reference to FIG. 5A. In addition, the transparent conductive layer may include a conductive polymer, a metal nanowire, and/or graphene.

The first conductive layer SE1 according to an exemplary embodiment of the present inventive concept may include a first connection part CP1. The first connection part CP1 may be disposed on the encapsulation substrate EN. The first connection part CP1 according to an exemplary embodiment of the present inventive concept may be disposed directly on the encapsulation substrate EN.

The second conductive layer SE2 may include a first sensor unit SP1, a second sensor unit SP2, a second connection part CP2, and a second signal line SL2.

The second sensor unit SP2 and the second connection part CP2 may be disposed in a separate layer from the first connection part CP1 with the first sensing insulation layer SIL1 interposed therebetween. The first sensor unit SP1 may be disposed on a different layer from the first connection part CP1 connected thereto. For example, the first sensor unit SP1 may be connected to the first connection part CP1 through a sensing contact hole SCH formed in the first sensing insulation layer SIL1. The first sensor unit SP1 may be spaced apart from the second sensor unit SP2 and the second connection part CP2 on the same layer. The first sensor unit SP1 may include mesh lines connected to each other on a region.

The second sensor unit SP2 and the second connection part CP2 may include mesh lines connected to each other on a region. The second signal line SL2 may include mesh lines connected to the second sensor SP2 on a region.

The first sensor unit SP1, the first connection part CP1, the second sensor unit SP2, and the second connection part CP2 may overlap the active area AA, and the second signal line SL2 may overlap the peripheral area NAA. However, the present inventive concept is not limited thereto. The positions of the first connection part CP1 and the second connection part CP2 may be variously changed.

According to an exemplary embodiment of the present inventive concept, the first blocking pattern IB and the second blocking pattern OH may be disposed on a same layer as the first connection part CP1. Also, the first sensing insulation layer SIL1 may extend to a region of the encapsulation substrate EN that overlaps the peripheral area NAA. Accordingly, the first sensing insulation layer SIL1 may cover the first blocking pattern IB and the second blocking pattern OB.

The first blocking pattern IB and the second blocking pattern OB may be spaced apart from each other and have a predetermined separation space BG therebetween. The sealing unit SL may overlap the separation space BG. According to an exemplary embodiment of the present inventive concept, the width of the sealing unit SL may be less than or equal to the space between the first blocking pattern IB and the second blocking pattern OB.

The connection pattern BL may be disposed in a same layer (e.g., the second sensing insulation layer SIL2) as the first sensor unit SP1, the second sensor unit SP2, and the second connection pan CP2. The second sensing insulation layer SIL2 may be disposed on the encapsulation substrate EN and may extend across the region of the encapsulation substrate EN overlapping the peripheral area NAA. Accordingly, the second sensing insulation layer SIL2 may cover the connection pattern BL.

The connection pattern BL may be connected to the first blocking pattern IB and the second blocking pattern IB through the contact holes SNT1 and SNT2, respectively, disposed on the first sensing insulation layer SIL1.

Figure 6B:
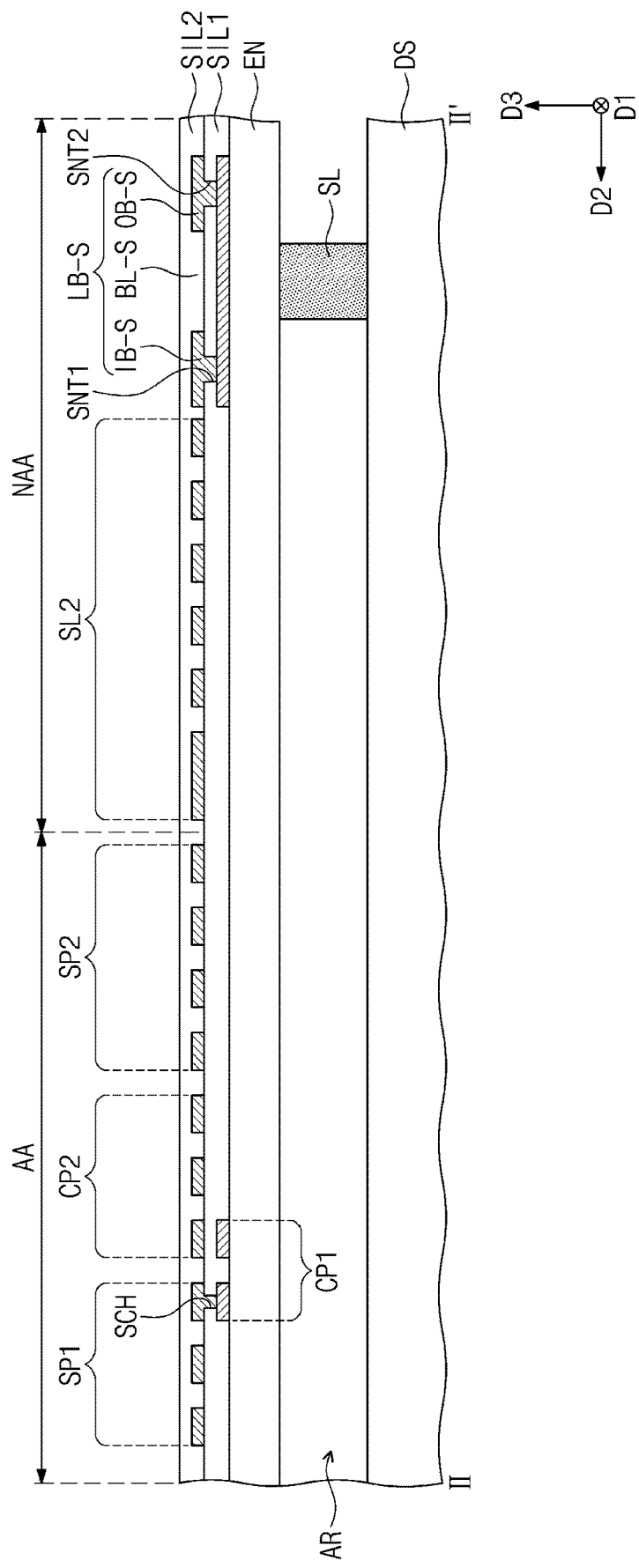
FIG. 6B is a cross-sectional view illustrating a cross-section taken along line II-II' of the display device shown in FIG. 4, according to an exemplary embodiment of the present inventive concept.

FIG. 6B is a cross-sectional view illustrating a cross-section taken along line II-II' of the display device shown in FIG. 4, according to an exemplary embodiment of the present inventive concept. The same/similar reference numerals may be used for the same/similar components as those shown in FIGS. 1 to FIG. 6A, and redundant descriptions thereof are omitted for convenience of description.

According to an exemplary embodiment of the present inventive concept, a static electricity blocking unit BL-S may include a connection pattern BL-S, a first blocking pattern IB-S, and a second blocking pattern OB-S.

The connection pattern BL-S may be disposed in the same layer (e.g., the first sensing insulation layer SIL1) as the first connection part CP1. The connection pattern BL-S may be at least partially covered by the first sensing insulation layer SIL1.

The first blocking pattern IB-S and the second blocking pattern OB-S may be disposed in the same layer (e.g., the second sensing insulation layer SIL2) as the first sensor unit SP1, the second sensor unit SP2, and the second connection part CP2. The first blocking pattern IB-S may be connected to the connection pattern BL-S through the first contact hole SNT1 formed on the first sensing insulation layer SIL1. The second blocking pattern OB-S may be connected to the connection pattern BL-S through the second contact hole SNT2 formed in the first sensing insulation layer SIL1. The first blocking pattern IB-S and the second blocking pattern OB-S may be at least partially covered by the second sensing insulation layer SIL2.

Figure 7A:
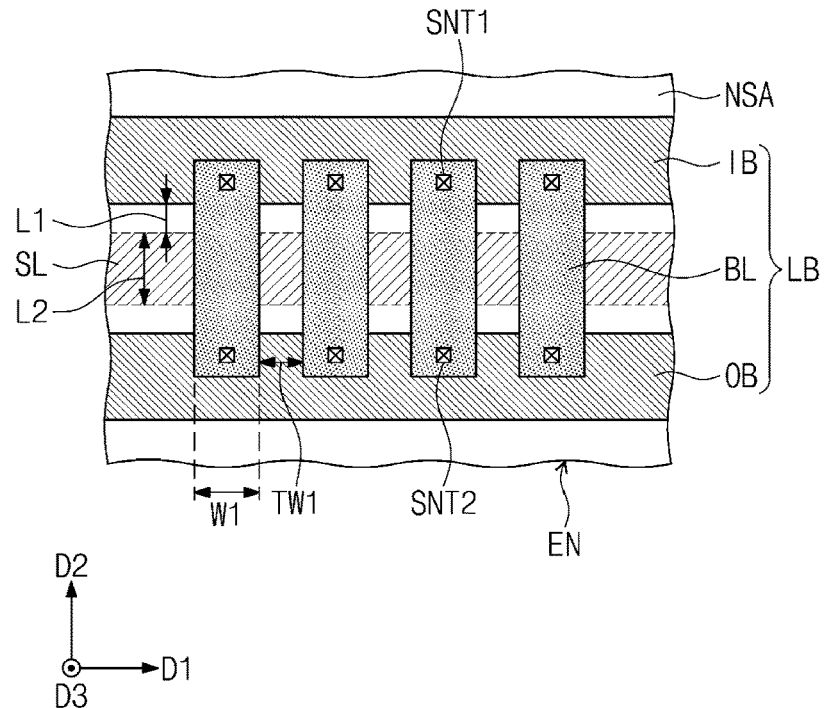
FIG. 7A is an enlarged plan view illustrating a static electricity blocking unit included in a display device according to an exemplary embodiment of the present inventive concept.
Figure 7B:
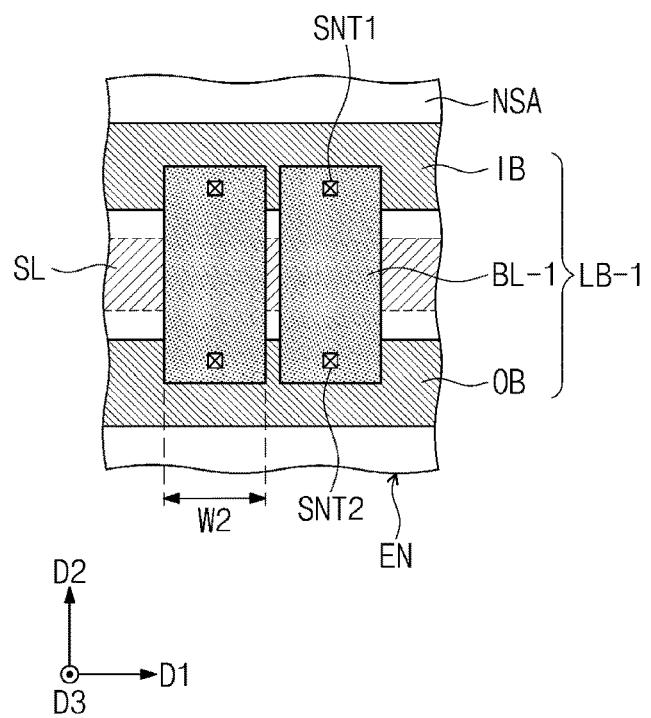
FIG. 7B and FIG. 7C are enlarged plan views illustrating a static electricity blocking unit according to an exemplary embodiment of the present inventive concept.
Figure 7C:
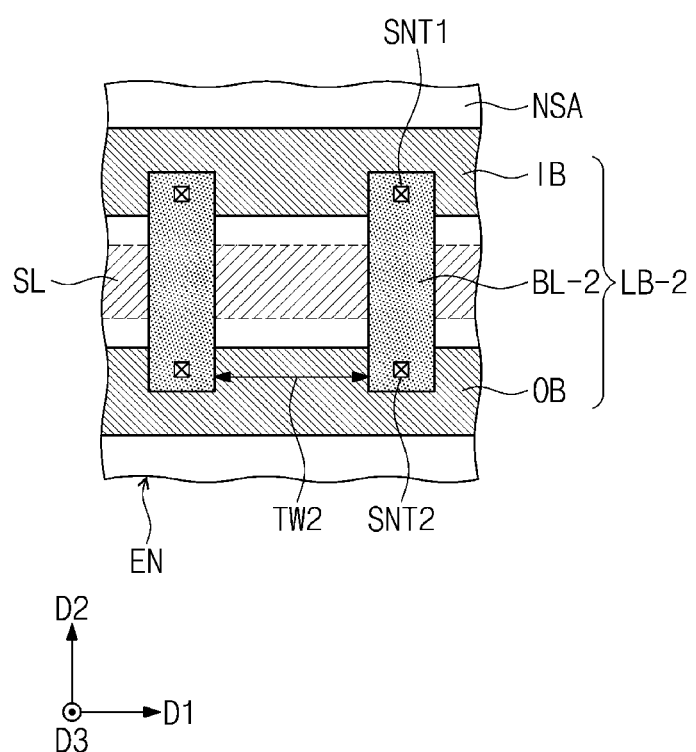

FIG. 7A is an enlarged plan view illustrating a static electricity blocking unit included in a display device according to an exemplary embodiment of the present inventive concept. FIG. 7B and FIG. 7C are plan views of a static electricity blocking unit according to exemplary embodiments of the present inventive concept. In FIG. 7A to FIG. 7C, the projected sealing part SL is indicated with dotted lines. Referring to FIG. 7A, each of the first blocking pattern IB and the second blocking pattern OB may be spaced apart from the sealing unit SL on a plane. For example, the first blocking pattern IB may be spaced apart from the sealing unit SL in a second direction (e.g., along the D2 direction) to have a first width L1 from an adjacent side of the sealing unit SL. For example, the first width L1 may be 40 µm. The second blocking pattern OB may be spaced apart from the sealing unit SL in the second direction (e.g., along the D2 direction) by the first width L1.

When viewed from a plan view, the sealing unit SL may have a width represented by a second width L2 extending in a second direction (e.g., the D2 direction). The second width L1 may be 530 µm. However, the present inventive concept is not limited thereto. The first width L1 and the second width L2 may vary depending on the purpose of the sealing unit SL.

The connection pattern BL according to an exemplary embodiment of the present inventive concept may have the first width WI in the first direction (e.g., the D1 direction). The connection pattern BL may be provided in plurality and spaced apart from each other by a first interval TW1 in the first direction D1.

Referring to FIG. 7B, a static electricity blocking unit LB-1 according to an exemplary embodiment of the present inventive concept may include the first blocking pattern IB, the second blocking pattern OB, and a connection pattern BL-1. The connection pattern BL-1 may have a second width W2 in the first direction (e.g., the D1 direction). The second width W2 may be larger than the first width W1.

Since the connection pattern BL-1 has the second width W2, the resistance of the connection pattern BL-1 may be increased relative to the resistance of the connection pattern BL with the first width W1 depicted in FIG. 7A. Accordingly, static electricity introduced from the outside may be efficiently offset.

Referring to FIG. 7C, the static electricity blocking unit LB-2 according to an exemplary embodiment of the present inventive concept may include the first blocking pattern IB, the second blocking pattern OB, and a connection pattern BL-2. The connection pattern BL-2 may be provided in plurality and spaced apart from each other by a second interval TW2 in the first direction D1. The second interval TW2 between connection patterns BL-2 may be larger than the first interval TW1 between the consecutive connection patterns BL depicted in FIG. 7A.

Since the interval between the connection patterns BL-2 may be increased, the transmittance of the laser light onto the sealing unit SL being irradiated during the curing process may be increased. Accordingly, the adhesion force between the display substrate DS and the encapsulation substrate EN may be increased, so that a display device with increased strength against external impact may be provided.

Figure 8A:
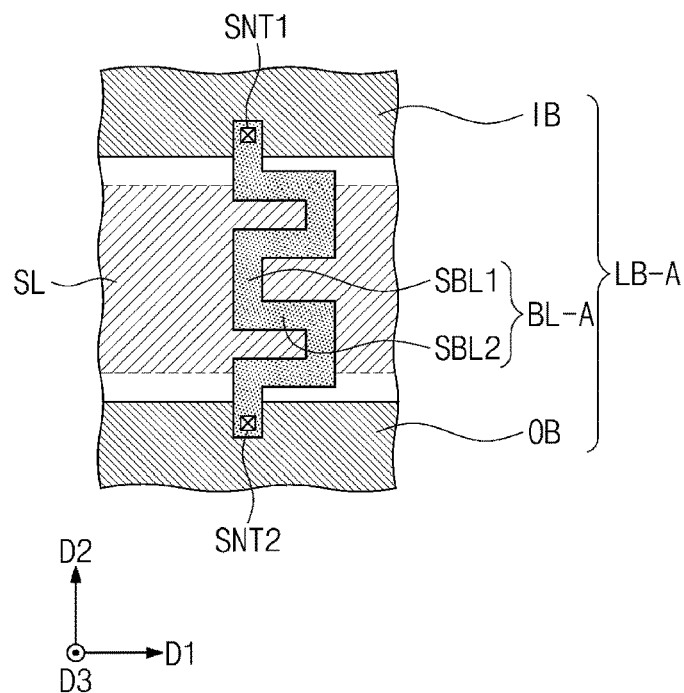
FIGS. 8A to FIG. 8C are enlarged plan views illustrating blocking patterns included in a static electricity blocking unit according to exemplary embodiments of the present inventive concept.
Figure 8B:
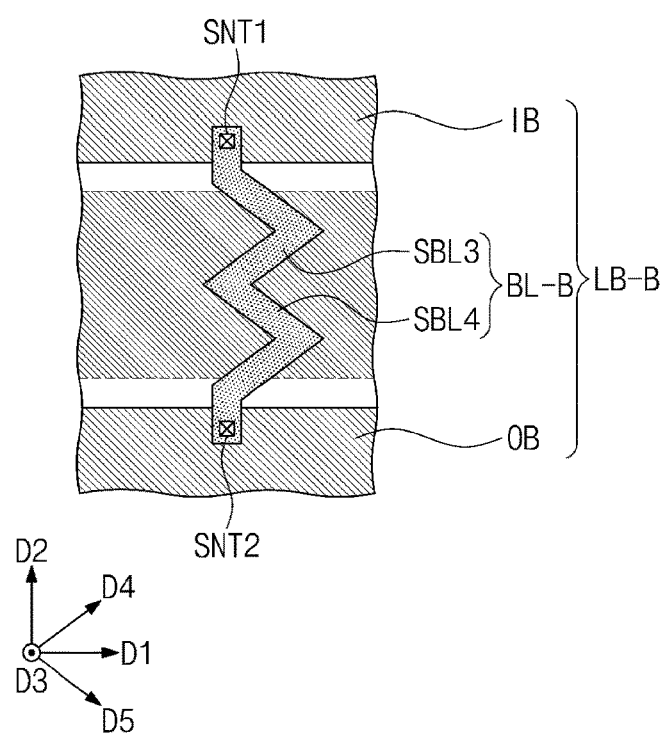
Figure 8C:
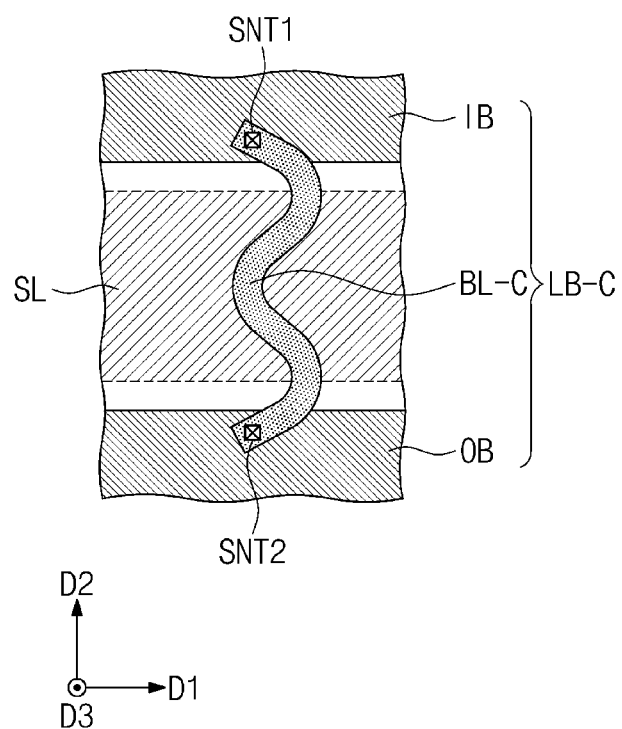

FIG. 8A to FIG. 8C are plan views illustrating blocking patterns included in a static electricity blocking unit according to exemplary embodiments of the present inventive concept. In FIG. 8A to FIG. 8C, the projected sealing part SL is indicated with dotted lines. Referring to FIG. 8A, a static electricity blocking unit LB-A according to an exemplary embodiment of the present inventive concept may include the first blocking pattern IB, the second blocking pattern OB, and a connection pattern BL-A. The connection pattern BL-A may include a first sub-pattern SBL1 and a second sub-pattern SBL2.

The first sub-pattern SBL1 may extend in the second direction (e.g., the D2 direction). The sub-pattern SBL2 may extend in the first direction (e.g., the D1 direction). One side of the first sub-pattern SBL1 may be orthogonally connected to one side of the second sub-pattern SBL2 to form a pattern having a shape of "⅂" or "∟." The first sub-pattern SBL1 and the second sub-pattern SBL2 may each be provided in plurality, and the plurality of patterns may be alternately disposed. Accordingly, the connection pattern BL-A may include a zig-zag shape that extends in the second direction (e.g., the D2 direction).

Referring to FIG. 8B, a static electricity blocking unit LB-B according to the inventive concept may include the first blocking pattern IB, the second blocking pattern OB, and a connection pattern BL-B. The connection pattern BL-B may include a third sub-pattern SBL3 and a fourth sub-pattern SBL4.

The third sub-pattern SBL3 may extend in a fourth direction (e.g., the D4 direction). The fourth sub-pattern SBL4 may extend in a fifth direction (e.g., the D5 direction). One side of the third sub-pattern SBL3 may be connected to one side of the fourth sub-pattern SBL4 to form a pattern having a shape of ">" or "<." The first sub-pattern SBL1 and the second sub-pattern SBL2 may each be provided in plurality, and the plurality of patterns may be alternately disposed. Accordingly, the connection pattern BL-B may include a zig-zag shape that extends in the second direction (e.g., the D2 direction).

Referring to FIG. 8C, a static electricity blocking unit LB-C according to an exemplary embodiment of the present inventive concept may include the first blocking pattern the second blocking pattern OB, and a connection pattern BL-C. The connection pattern BL-C may have a curved shape extended in the second direction (e.g., the D2 direction).

According to an exemplary embodiment of the present inventive concept, by lengthening the connection patterns BL-A, BL-B, and BL-C, a path through which static electricity introduced from the outside passes through the static electricity blocking units LB-A, LB-B, and LB-C may be extended. Since the length of the connection patterns BL-A, BL-B, and BL-C are increased, the resistance of the connection patterns BL-A, BL-B, and BL-C is also increased. Accordingly, static electricity introduced into the input sensing layer TU is gradually offset while passing through the connection patterns BL-A, BL-B, and BL-C, so that a display device with increased reliability may be provided.

Figure 9:
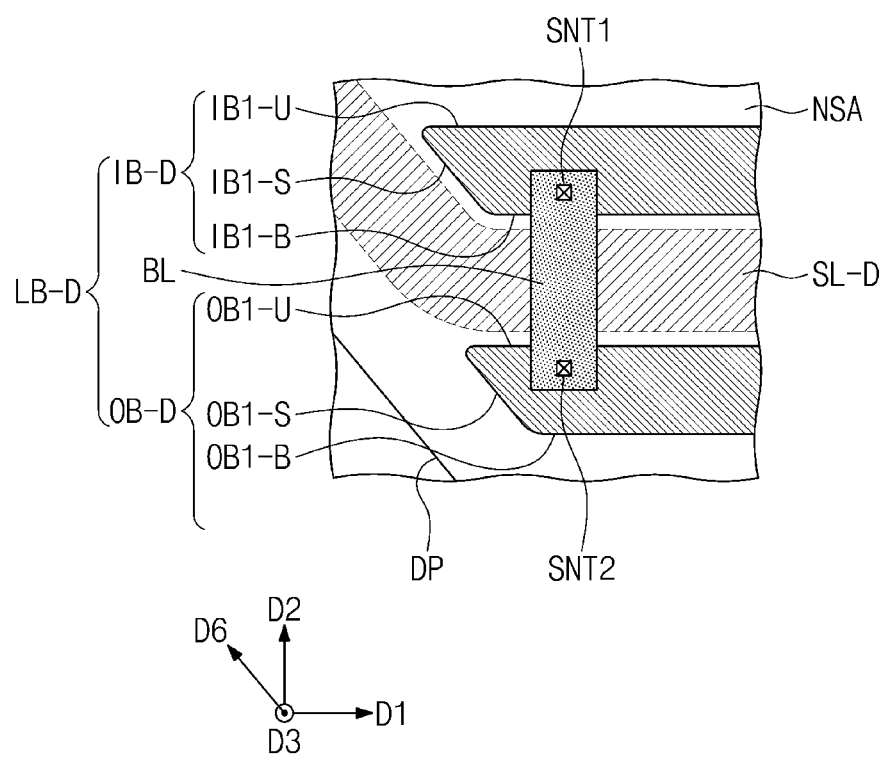
FIG. 9 is an enlarged plan view illustrating a static electricity blocking unit according to an exemplary embodiment of the present inventive concept.

FIG. 9 is an enlarged plan view of a static electricity blocking unit according to an exemplary embodiment of the present inventive concept. In FIG. 9, a projected sealing part SL-D is indicated with dotted lines. Referring to FIG. 9, a shape of the sealing unit SL-D according to an exemplary embodiment of the present inventive concept may be variously changed depending on a shape of the display panel DP. For example, when the display panel DP has a curved shape, such as curved edges, the sealing unit SL-D may also have a curved shape along edges of the display panel DP. The sealing unit SL-D may have a curved shaped. For example, the sealing unit SL-D may include a first portion that extends in the first direction (e.g., the first direction) and a second portion that extends in the sixth direction (e.g., the D6 direction) and is attached to an end of the first portion.

A static electricity blocking unit LB-D may include a first blocking pattern IB-D, a second blocking pattern OB-D, and a connection pattern BL. The first blocking pattern IB-D may include a first upper portion IB1-U, a first lower portion IB1-B, and a first side portion IB1-S. The first upper portion IB1-U may be spaced apart from the second blocking pattern OB-D further than the first lower portion IB1-B. The first side portion IB1-S may connect the first upper portion IB1-U and the first lower portion IB1-B. The first side portion IB1-S may be inclined from an end of the first lower portion IB1-B toward an end of the first upper portion IB1-U.

The second blocking pattern OB-D may include a second upper portion OB1-U, a second lower portion OB1-B, and a second side portion OB1-S. The second upper portion OB1-U may be spaced apart from the first blocking pattern IB-D at a smaller distance in the second direction (e.g., the D2 direction) than a distance in the second direction (e.g., the D2 direction) between the second lower portion OB1-B and the first blocking pattern IB-D. The second side portion OB1-S may connect the second upper portion OB1-U and the second lower portion OB1-B.

The second side portion OB1-S may be inclined from an end of the second lower portion OB1-B toward an end of the second upper portion OB1-U.

In FIG. 9, the sealing unit SL-D is shown as curved in one direction and the side portions IB1-S and OB1-S corresponding to the shape of the sealing unit SL-D are shown, but the inventive concept is not limited thereto. The shape of the sealing unit SL-D and the shape of the blocking patterns IB-D and OB-D may be variously changed.

FIG. 10A to FIG. 10G are cross-sectional views illustrating steps in a method of manufacturing a display device according to an exemplary embodiment of the present inventive concept. The same reference numerals are used to refer to the same elements previously introduced in FIG. 1 to FIG. 6A, and redundant descriptions thereof are omitted. Hereinafter, with reference to FIG. 10A to FIG. 10G, a method of manufacturing a display device according to an exemplary embodiment of the present inventive concept will be described.

Referring to FIG. 10A, the method of manufacturing a display device according to an exemplary embodiment of the present inventive concept may include a step for forming a display panel. In the step for forming a display panel DP, a display substrate DS, an encapsulation substrate EN, and a preliminary sealing unit SL-A may be provided. Each of the display substrate DS and the encapsulation substrate EN may have a configuration corresponding to that of the display substrate DS and the encapsulation substrate EN described with reference to FIG. 5A.

The preliminary sealing unit SL-A may be disposed between the display substrate DS and the encapsulation substrate EN. The preliminary sealing unit SL-A may include frit. The preliminary sealing unit SL-A may be provided in a pre-curing state, prior to being irradiated with a laser light.

Referring to FIG. 10B, the method of manufacturing a display device according to an exemplary embodiment of the present inventive concept may include forming a preliminary conductive layer. A first preliminary conductive layer DM1 may be formed on the encapsulation substrate EN. For example, the first preliminary conductive layer DM1 may be formed on the encapsulation substrate EN overlapping the active area AA and the peripheral area NAA. The first preliminary conductive layer DM1 may include a conductive material. For example, the first preliminary conductive layer DM1 may include molybdenum (Mo), molybdenum oxide (MoOx), molybdenum niobium (MoNb), APC (Ag—Pd—Cu) alloy, nickel (Ni), copper (Cu), and/or an alloy thereof.

Figure 10C:
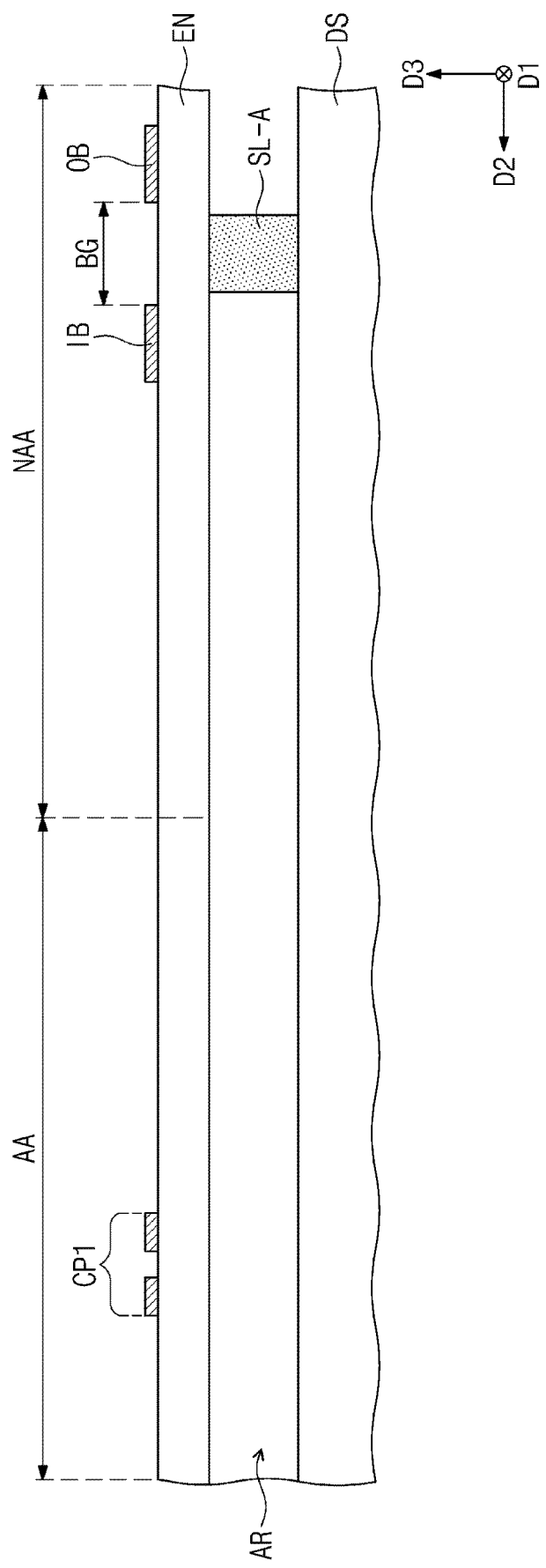

Referring to FIG. 10C, the method of it a display device according to an exemplary embodiment of the present inventive concept may include forming a first conductive layer and blocking patterns. The first conductive layer may be formed by patterning the first preliminary conductive layer DM1 overlapping the active area AA.

The first conductive layer may correspond to the first conductive layer SE1 described above with reference to FIG. 5A. For example, the first connection part CP1 may be formed in the first conductive layer SE1. The plurality of blocking patterns IB and OB may be spaced apart from each other and have a predetermined separation space BG. The blocking patterns IB and OB may be formed by patterning the first preliminary conductive layer DM1 overlapping the peripheral area NAA. At least a portion of the preliminary sealing unit SL-A may overlap the separation space BG when viewed in a plan view and/or a cross-sectional view.

According to an exemplary embodiment of the present inventive concept, the first connection part CP1 and the blocking patterns IB and OB included in the first conductive layer may be formed during a same process. For example, the first connection part CP1 and the blocking patterns IB and OB may be formed by patterning the first preliminary conductive layer DM1 using a same first mask. Accordingly, the first conductive layer SE1 and the blocking patterns IB and OB may have the same thickness along the third direction D3, and may also include the same material.

Figure 10D:
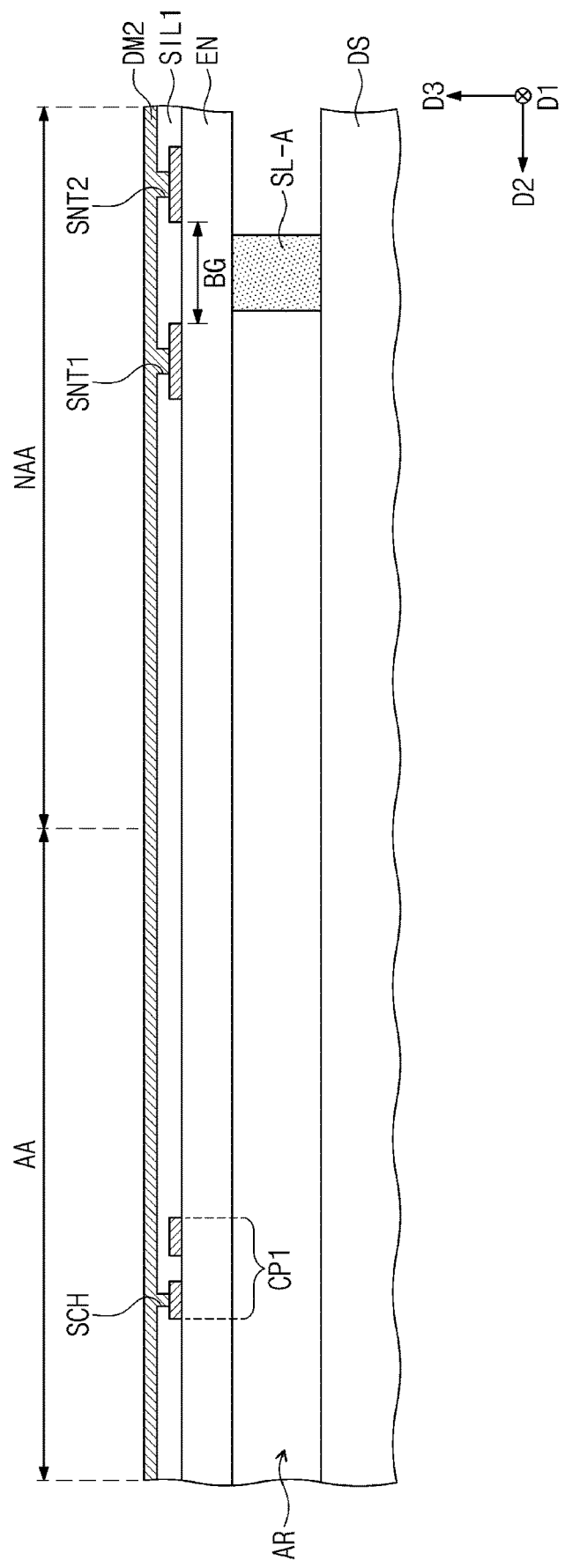

Referring to FIG. 10D, the method of manufacturing a display device may include a step of forming a second preliminary conductive layer. The second preliminary conductive layer DM2 may be formed on the encapsulation substrate EN overlapping the active area AA and the peripheral area NAA. The second preliminary conductive layer DM2 may be formed after a first sensing insulation layer SIL1 is formed.

The first sensing insulation layer SBA may be thrilled on the encapsulation substrate EN overlapping the active area AA and the peripheral area NAA. Accordingly, the first sensing insulation layer SU may cover the first connection part CP1 and the blocking patterns IB and OB. The first sensing insulation layer SIL1 may be formed with a plurality of contact holes SCH, SNT1, and SNT2.

The second preliminary conductive layer DM2 may be formed on the first sensing insulation layer SIL1. The second preliminary conductive layer DM2 may include a transparent conductive material. For example, the second preliminary conductive layer DM2 may include indium tin oxide, indium zinc oxide, indium gallium zinc oxide, fluorine zinc oxide, gallium zinc oxide, and/or tin oxide. In addition, the transparent conductive layer may include a conductive polymer, a metal nanowire and/or graphene.

Figure 10E:
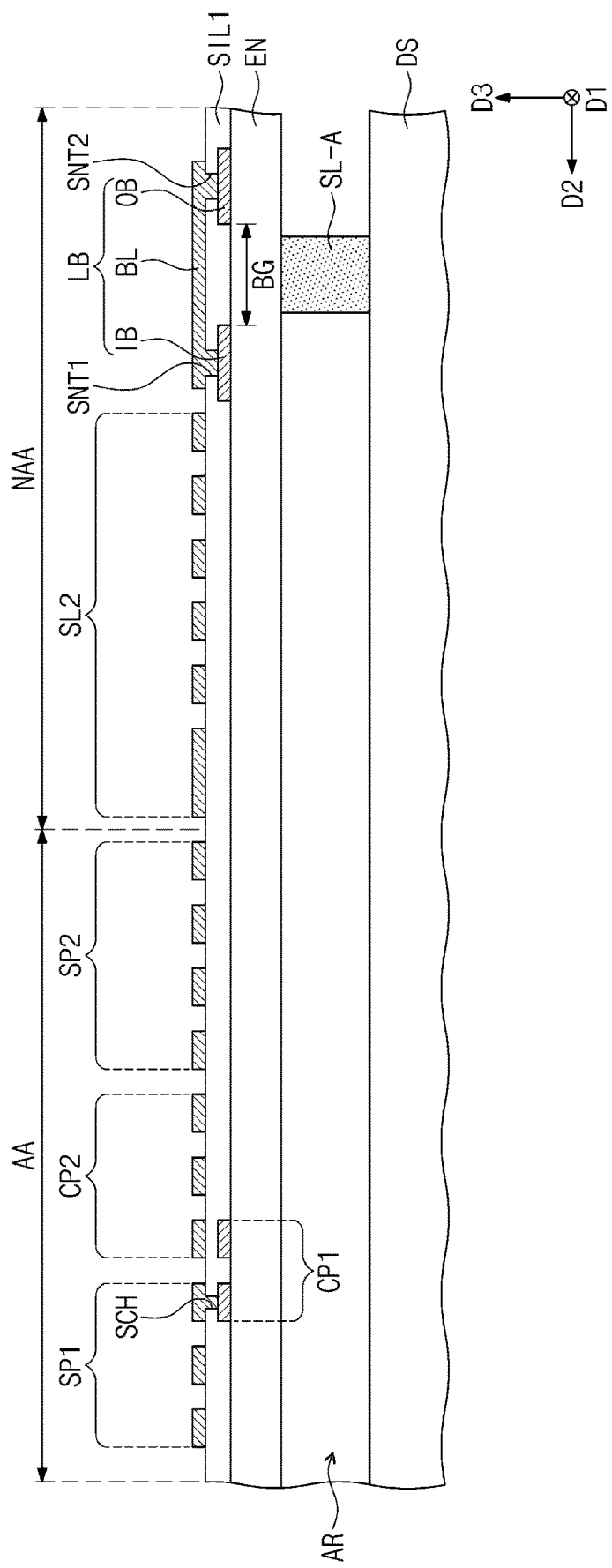

Referring to FIG. 10E, the method for manufacturing a display device may include a step for forming a second conductive layer and a connection pattern. The second conductive layer may be formed by patterning the second preliminary conductive layer DM2 overlapping the active area AA.

The second conductive layer may correspond to the second conductive layer SE2. The second conductive layer SE2 may include the first sensor unit SP1, the second sensor unit SP2, and the second connection part CP2. The first sensor unit SP1 may be connected to the first connection part CP1 through the contact hole SCH formed on the first sensing insulation layer SIL1.

The connection pattern BL may be formed by patterning the second preliminary conductive layer DM2 overlapping the peripheral area NAA. The connection pattern BL may overlap the preliminary sealing unit SL-A. The connection pattern BL is connected to the blocking patterns IB and OB through the contact holes SNT1 and SNT2.

According to an exemplary embodiment of the present inventive concept, the first sensor unit SP1, the second sensor unit SP2, and the second connection pan CP2 included in the second conductive layer SE2 may be formed during the same process as the connection pattern BL. For example, the second conductive layer and the connection pattern BL may be formed by patterning the second preliminary conductive layer DM2 using a same second mask. Accordingly, the second conductive layer SE2 and the connection pattern BL may have a same thickness along the third direction D3, and may also include a same material.

Figure 10F:
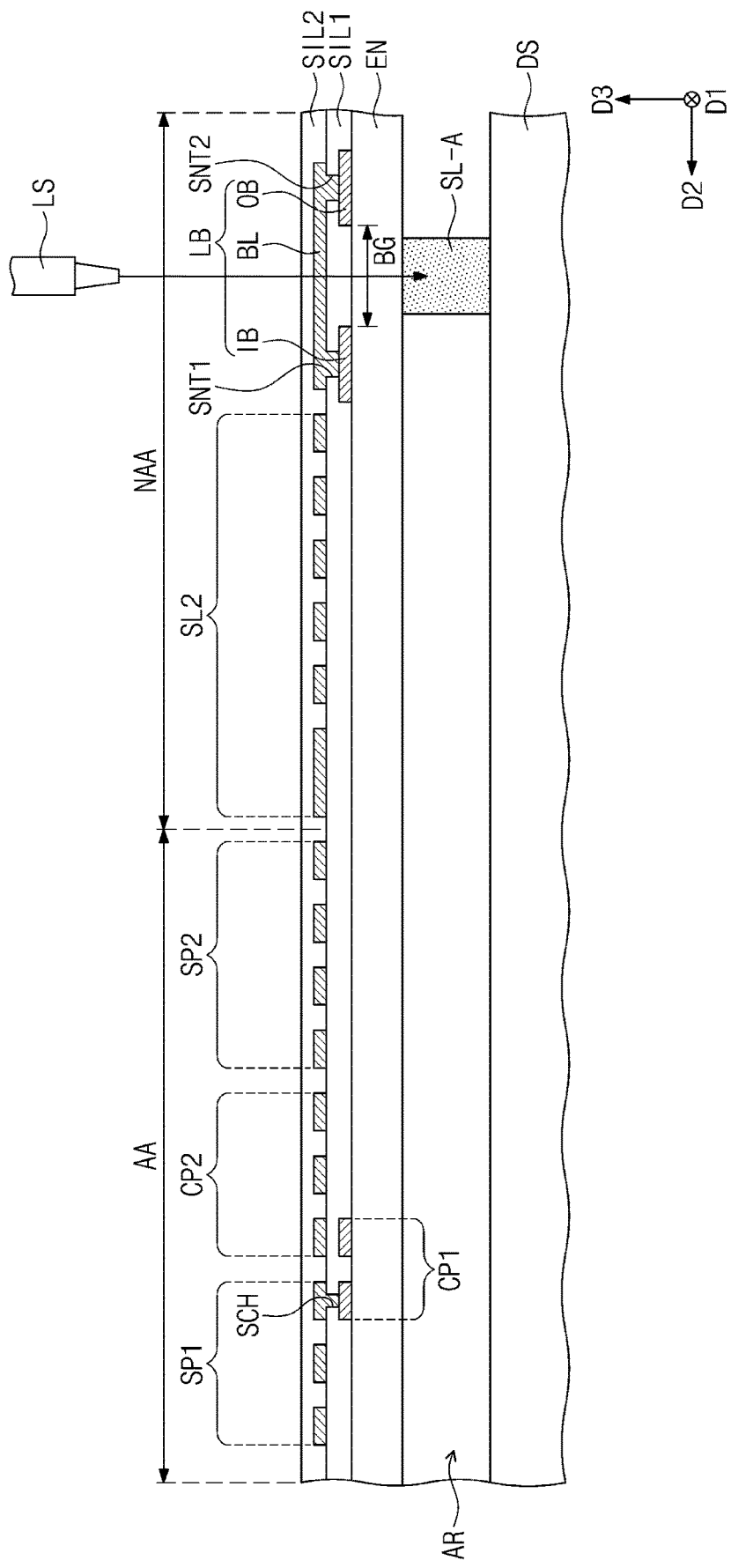
Figure 10G:
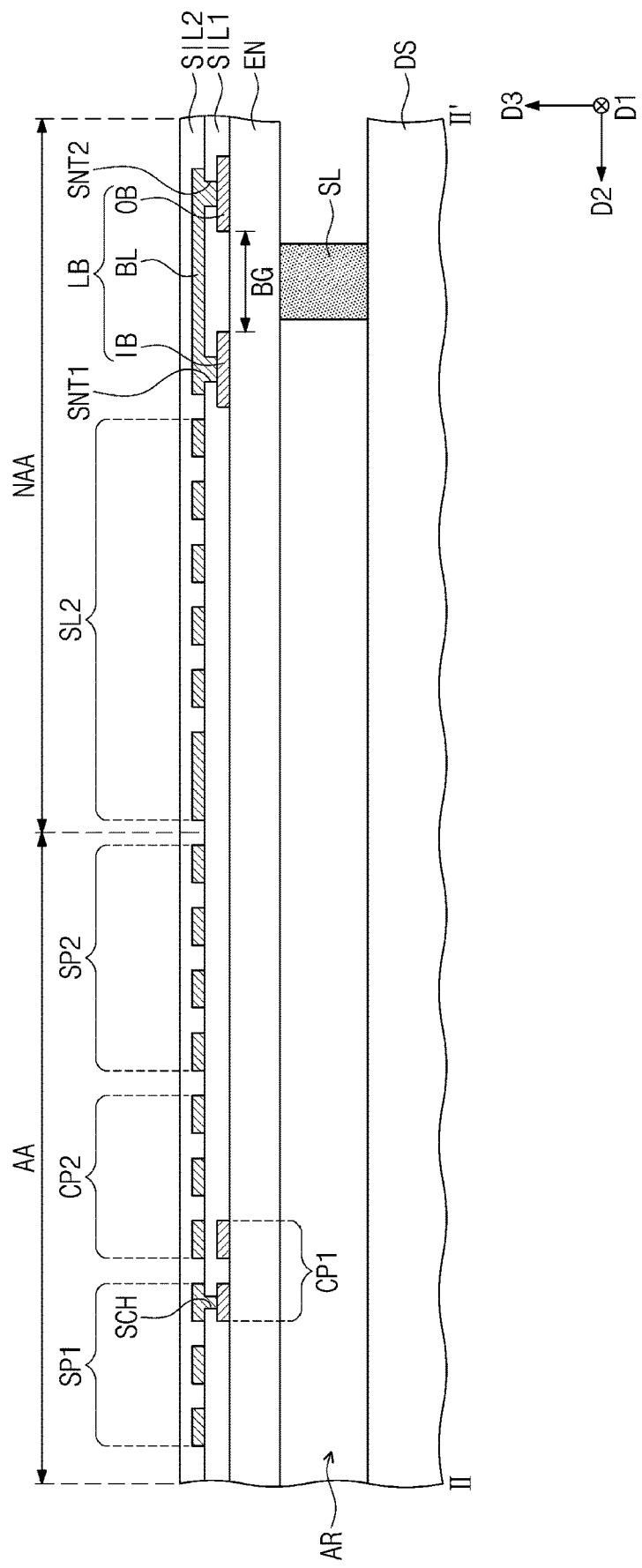

Referring to FIG. 10F and FIG. 10G, the method for manufacturing a display device may include forming a sealing unit. The sealing unit SL may be formed by directing laser light LS onto the separation space BG formed between the blocking patterns IB and OB to cure the preliminary sealing unit SL-A.

According to an exemplary embodiment of the present inventive concept, by controlling the width of the separation space BG formed between the blocking patterns IB and OB according to a desired width of the sealing unit SL, the area of the preliminary sealing unit SL-A irradiated by the laser light LS may be controlled. Accordingly, by preventing the generation of unnecessary space caused by the protrusion of the sealing unit SL in a curing process, a display device having a slim peripheral area NAA is provided.

When the preliminary sealing unit SL-A is irradiated with the laser light LS, the connection pattern BL overlapping the preliminary sealing unit SL-A may be irradiated with the lase light also, thereby affecting the curing of the preliminary sealing unit SL-A. However, according to an exemplary embodiment of the present inventive concept, the connection pattern BL may include a transparent conductive material having high light transmittance, so that the connection pattern BL might not affect the sealing SL from being irradiated with the laser light.

According to the exemplary embodiments of the present inventive concept described heretofore, since the components of the input sensing layer TU and the components of the static electricity blocking unit LB may be formed in the same process, and since the components of an input sensing layer and the components of a static electricity blocking unit are formed in a same process, cost and time required for manufacturing a display device may be reduced.

Furthermore, since a static electricity blocking unit including components having different resistances may be included, static electricity introduced from the outside may be efficiently blocked.

Although the inventive concept has been described with reference to a preferred embodiment of the inventive concept, it will be understood by those skilled in the art that various changes in form and details may be made therein without departing from the spirit and scope of the inventive concept.

What is claimed is:

1. A display device comprising:
   a substrate including a base layer including an active area and a peripheral area adjacent to the active area, a circuit element layer disposed on the base layer, a display element layer electrically connected to the circuit element layer and configured to provide light;
   an encapsulation substrate disposed on the substrate;
   a sealing unit disposed between the substrate and the encapsulation substrate and overlapping the peripheral area;
   an input sensing layer disposed on the encapsulation substrate and including a first conductive layer and a second conductive layer spaced apart from each other With a sensing insulation layer interposed therebetween; and
   a static electricity blocking unit disposed on the encapsulation substrate,
   wherein the static electricity blocking unit includes a first blocking pattern and a second blocking pattern spaced apart from each other by a space, and a connection pattern which connects the first blocking pattern and the second blocking pattern, the connection pattern including a plurality of segments, that are spaced apart from each other, disposed above the first and second blocking pattern, each of the plurality of segments connecting the first blocking pattern and the second blocking pattern to each other across the seating unit,
   wherein at least a portion of the sealing unit overlaps the space between the first blocking pattern and the second blocking pattern, and
   wherein a width of the sealing unit is less than a width of the space between the first blocking pattern and the second blocking pattern.

2. The display device of claim 1, wherein at least one of the first blocking pattern and the second blocking patters has a first resistance, and the connection pattern has a second resistance greater than the first resistance.

3. The display device of claim 1, wherein a portion of the connection pattern overlaps the sealing unit in a plan view.

4. The display device of claim 1, wherein the connection pattern comprises a transparent conductive material.

5. The display device of claim 1, wherein an internal space is formed between the substrate and the encapsulation substrate and the sealing unit is disposed within the internal space.

6. The display device of claim 1, wherein the connection pattern has a zig-zag shape.

7. The display device of claim 1, wherein the connection pattern includes a curved shape.

8. The display device of claim 1, wherein the first blocking, pattern is disposed closer to the active area than the second blocking pattern.

9. The display device of claim 1, wherein at least one of the first blocking pattern and the second blocking pattern comprises:
   an upper portion adjacent to the active area;
   a lower portion opposite to the upper portion; and
   a side portion connecting the upper portion and the lower portion,
   wherein the side portion is inclined from an end of the lower portion toward an end of the upper portion.

10. The display device of claim 1, wherein the static electricity blocking unit further comprises an additional blocking pattern spaced apart from the second blocking pattern with the input sensing layer interposed therebetween, and the additional blocking pattern is disposed in a same layer as the first conductive layer.

11. The display device of claim 1, wherein the circuit element layer further comprises a semiconductor layer including a transistor; the display element layer further comprises a first electrode, a second electrode disposed opposite to the first electrode, and an organic light emitting element including a light emitting pattern disposed between the first electrode and the second electrode, and the light emitting pattern does not overlap the first conductive layer and the second conductive layer on a plane.

12. The display device of claim 1, wherein the sealing unit comprises frit.

13. The display device of claim I, wherein the sensing insulation layer includes first contact holes overlapping the first blocking pattern and second contact holes overlapping the second blocking pattern, and the connection pattern is connected to the first blocking pattern through the first contact holes and connected to the second blocking pattern through the second contact holes.

14. A display device comprising:
   a substrate including, a base layer including an active area and a peripheral area disposed adjacent to the active area, an encapsulation substrate covering the substrate, and a sealing unit disposed between the substrate and the encapsulation substrate and overlapping the peripheral area;
   an input sensing layer disposed on the encapsulation substrate and including a first conductive layer and a second conductive layer spaced apart from each other with a sensing insulation layer interposed therebetween; and
   a static electricity blocking unit disposed on the encapsulation substrate and overlapping the peripheral area,
   wherein the static electricity blocking unit includes a first blocking pattern and a second blocking pattern each having, a first resistance and the first blocking pattern and the second blocking pattern are spaced apart from each other by a space, and a connection pattern having a second resistance connected to the first blocking pattern at one end and the second blocking pattern at another end, the connection pattern including a plurality of segments, that are spaced apart from each other, disposed above the first and second blocking pattern, each of the plurality of segments connecting the first blocking pattern and the second blocking pattern to each other across the scaling unit,
   wherein the second resistance is greater than the first resistance, and
   wherein a width of the sealing unit is less than a width of the space between the first blocking pattern and the second blocking pattern.

15. The display device of claim 14, wherein at least a portion of the sealing unit overlaps the space.

16. The display device of claim 14, wherein the first blocking pattern and the second blocking pattern are disposed in a same sensing insulation layer as the first conductive layer, and the connection pattern is disposed in a same sensing insulation layer as the second conductive layer.

17. The display device of claim 14, wherein a portion of the connection pattern overlaps the sealing unit in a plan view.

18. The display device of claim 14, wherein the connection pattern comprises a transparent conductive material.

19. A method for manufacturing a display device, the method comprising:
providing a display panel including a substrate having a plurality of pixels and divided into an active area on which the pixels are formed and a peripheral area adjacent to the active area, an encapsulation substrate at least partially covering the substrate, and a preliminary sealing unit disposed between the substrate and the encapsulation substrate in the peripheral area;
forming a first preliminary conductive layer on the encapsulation substrate;
forming a first conductive layer by patterning a portion of the first preliminary conductive layer overlapping the active area;
forming a plurality of blocking patterns spaced apart from each other by a predetermined space by patterning a portion of the first preliminary conductive layer overlapping the peripheral area;
forming a second preliminary conductive layer on the first conductive layer;
forming a second conductive layer by patterning a portion of the preliminary second conductive layer overlapping the active area;
forming a connection pattern which connects the blocking patterns by patterning a portion of the preliminary second conductive layer overlapping the peripheral area, the connection pattern including a plurality of segments, that are spaced apart from each other, disposed above the plurality of blocking pattern, each of the plurality of segments connecting a first blocking pattern, of the plurality of blocking patterns, and a second blocking pattern, of the plurality of blocking patterns, to each other across a preliminary sealing unit; and
forming a sealing unit by irradiating the preliminary sealing unit with a laser,
wherein the sealing unit is firmed by irradiating the preliminary sealing unit with the laser through the predetermined space to cure the preliminary sealing unit, and
wherein a width of the sealing unit is less than a width of the predetermined space between the plurality of blocking patterns.

20. The method of claim 19, wherein the first conductive layer and the blocking patterns are formed using a first mask, and the second conductive layer and the connection pattern are formed using a second mask different from the first mask.

21. The display device of claim 1, here the first blocking pattern and the second blocking pane include a same material as the first conductive layer, and wherein the connection pattern includes a same material as the second conductive layer.

22. The display device of claim 1, wherein the sealing unit has a rectangular frame shape having four sides and only one of the four sides of the rectangular frame are surrounded by the first and second blocking patterns.

23. The display device of claim 5, wherein the internal space is evacuated or filled with nitrogen.

* * * * *